United States Patent
Kikuchi et al.

(12) 
(10) Patent No.: US 6,999,643 B2
(45) Date of Patent: Feb. 14, 2006

(54) METHOD OF MANUFACTURING OPTICAL WAVEGUIDE AND METHOD OF MANUFACTURING OPTO-ELECTRIC WIRING BOARD

(75) Inventors: Hideo Kikuchi, Tokyo (JP); Mikio Oda, Tokyo (JP); Hikaru Kouta, Tokyo (JP); Sakae Kitajo, Tokyo (JP); Yuzo Shimada, Tokyo (JP)

(73) Assignee: NEC Toppan Circuit Solutions, Inc., Tokyo (JP)

( * ) Notice: Subject to any disclaimer, the term of this patent is extended or adjusted under 35 U.S.C. 154(b) by 263 days.

(21) Appl. No.: 10/303,976

(22) Filed: Nov. 26, 2002

(65) Prior Publication Data

US 2003/0128907 A1 Jul. 10, 2003

(30) Foreign Application Priority Data

Nov. 26, 2001 (JP) .................................. 2001-360039

(51) Int. Cl.
*G02B 6/12* (2006.01)

(52) U.S. Cl. ...................... 385/14; 385/130; 385/90; 385/91; 385/92; 385/93; 385/89

(58) Field of Classification Search ................. 385/14, 385/18, 124, 145, 49, 50, 130, 89, 90, 91, 385/92, 93, 94; 257/431–433, 81, 98–99; 264/112, 259
See application file for complete search history.

(56) References Cited

U.S. PATENT DOCUMENTS

| 5,042,709 A | 8/1991 | Cina et al. |
| 6,341,190 B1 * | 1/2002 | Summersgill et al. ...... 385/130 |
| 6,477,284 B1 * | 11/2002 | Oda et al. ..................... 385/14 |
| 6,754,407 B1 | 6/2004 | Chakravorty et al. |

FOREIGN PATENT DOCUMENTS

| JP | 2001-015889 | 1/2001 |
| JP | 2001-154051 | 6/2001 |

* cited by examiner

Primary Examiner—John R. Lee
Assistant Examiner—David A. Vanore
(74) Attorney, Agent, or Firm—Burns, Doane, Swecker & Mathis, LLP

(57) ABSTRACT

After an optical waveguide substrate including a supporting substrate is adhered to an electric wiring board, the supporting substrate alone is dissolved using an organic solvent for removal. Alternatively, the supporting substrate alone is melted through a thermal treatment for removal. Further, a core layer of an optical waveguide is formed on the substrate using a photosensitive resin having a thermal expansion coefficient substantially identical to that of the supporting substrate.

19 Claims, 17 Drawing Sheets

METHOD OF MANUFACTURING OPTICAL WAVEGUIDE AND METHOD OF MANUFACTURING OPTO-ELECTRIC WIRING BOARD

BACKGROUND OF THE INVENTION

1. Field of the Invention

The present invention relates to a method of manufacturing an optical waveguide for use as an optical line, and a method of manufacturing an opto-electric wiring board which comprises optical waveguides and electric wires mixedly formed thereon.

2. Description of the Related Art

Generally, electronic parts such as LSI (Large Scale Integrated Circuit) are mounted on electric wiring boards formed with electric wires for assembly into a variety of electronic devices. An electronic device implements a predetermined function by transmitting electric signals through electric wires which interconnect respective electronic parts. Due to unwanted noise possibly generated during its operation, an electronic device adversely affects other electronic devices located nearby which would suffer from malfunctions, degraded performance, and the like. Also, in the electronic device, electric signals may experience a delay associated with a time constant determined by capacitive and resistive components contained in electric wires.

In recent years, on the other hand, an increasing prevalence has been achieved by optical communication technologies which employ optical signals as information transmission media for realizing a larger capacity and a higher speed of communications. To respond to the trend, optical communication devices have been aggressively under development for building optical communication networks, such as an optical exchanger, an optical interconnector, and the like.

In optical communication devices, optical waveguides formed on insulating substrates are used as optical lines for transmitting optical signals. An optical communication device does not adversely affect other optical communication devices or electronic devices located nearby because it does not generate noise in operation as is the case with an electronic device. In addition, optical lines are free from a loss of high frequency signals due to the skin effect of conductors. To take advantages of these features, a proposed device comprises optical lines which are partially substituted for electric wires to use optical signals instead of electric signals, thereby reducing adverse effects otherwise exerted on other surrounding electronic devices and realizing a higher speed of signal transmission.

The above-mentioned device employs an opto-electric wiring board which has electric wires and optical lines mixedly laminated thereon. However, an electric wiring board generally has a multiplicity of electric wiring layers for purposes of mounting electronic parts at a high density, so that the electric wiring board is formed with ruggedness on the surface due to the multiple wiring layers. If an optical waveguide is directly formed on the rugged surface for routing an optical line, the resulting optical waveguide will be distorted to cause a large transmission loss of an optical signal. For this reason, a need exists for techniques for laminating electric wires and optical lines on the same board while reducing a transmission loss of optical signals.

An example of such technique is disclosed, for example, in Japanese Patent Application Laid-open No. 2001-15889.

In the following, a method of manufacturing an opto-electric wiring board according to a first prior art will be described with reference to FIGS. 1A to 1E.

In the manufacturing method according to the first prior art, optical waveguide resin layer (optical line layer film) 103 is first formed on first supporting substrate 101 made of silicon through strip layer 102 made of Cr, Cu or the like for routing an optical line, as illustrated in FIG. 1A. Optical waveguide resin layer 103 is comprised of a lower cladding layer, an upper cladding layer, and a core layer sandwiched between the lower and upper cladding layers for transmitting an optical signal. First supporting substrate 101 is used to prevent thin optical waveguide resin layer 103 from deforming into a curled layer.

Next, as illustrated in FIG. 1B, strip layer 102 is dissolved to remove optical waveguide resin layer 103 from first supporting substrate 101.

Next, as illustrated in FIG. 1C, optical waveform resin layer 103 is adhered to second supporting substrate 105 made of glass using first adhesive 104. In this event, a known laminator, for example, is used to adhere optical waveguide resin layer 103 to second supporting substrate 105. Second supporting substrate 105 plays the same role as first supporting substrate 101.

Next, as illustrated in FIG. 1D, optical waveguide resin layer 103 adhered on second supporting substrate 105 is adhered to electric wiring board 107 which is a polyimide multi-layered wiring board formed with electric wires (not shown) on the surfaces, using second adhesive 106 made of a denaturation polyimide resin. Second adhesive 106 has a larger adhesion strength than first adhesive 104.

Finally, as illustrated in FIG. 1E, second supporting substrate 105 is stripped from optical waveguide resin layer 103 together with first adhesive 104, thereby completing opto-electric wiring board 108 which has optical waveguide resin layer 103 formed on electric wiring board 107.

Manufactured through the foregoing steps is opto-electric wiring board 108 which has optical waveguide resin layer 103 for providing optical lines and electric wires (not shown) formed on the same electric wiring board 107. In the structure as described above, since optical waveguide resin layer 103 is mounted on electric wiring board 107 through second adhesive 106, the optical lines will not be adversely affected by ruggedness on the surface of electric wiring board 107. This results in a reduction in transmission loss of optical signals.

A method of manufacturing an optical waveguide which can be mounted on an opto-electric wiring board is disclosed, for example, in Japanese Patent Application Laid-open No. 2001-154051 as a method of manufacturing an opto-electric wiring board according to a second prior art. In the following, the manufacturing method according to the second prior art will be described with reference to FIGS. 2A to 2D.

In the second prior art, first, intermediate cladding layer 113 and upper cladding layer 112 each made of a polyimide fluoride film are previously laminated sequentially on copper substrate 114, as illustrated in FIG. 2A. Intermediate cladding layer 113 is patterned into a predetermined shape using a known photolithography technique. A copper thick film is filled in remaining intermediate cladding layer 113 on upper cladding layer 112. Supporting substrate 111 made of aluminum is adhered on upper cladding layer 112.

Next, after copper substrate 114 and copper thick film 115 are removed, respectively, as illustrated in FIG. 2B, core layer 116 made of a polyimide fluoride film is formed in regions from which copper thick film 115 has been removed, as illustrated in FIG. 2C.

Next, as illustrated in FIG. 2D, lower cladding layer 117 made of a polyimide fluoride film is formed to cover intermediate cladding layer 113 and core layer 116. Finally, supporting substrate 111 is removed to complete optical waveguide 118. This optical waveguide 118 is adhered to an electric wiring board, separately fabricated, to provide an opto-electric wiring board.

The first mentioned method of manufacturing an opto-electric wiring board according to the first prior art has a problem of a long manufacturing time and a resulting increase in cost due to the requirement of a plurality of types of supporting substrates which include first supporting substrate 101 for forming optical waveguide resin layer 103 that provides optical lines (optical waveguide), and second supporting substrate 105 for holding optical waveguide resin layer 103 stripped from first supporting substrate 101.

Specifically, in the method of manufacturing an opto-electric wiring board according to the first prior art, first supporting substrate 101 made of silicon is used for forming optical waveguide resin layer 103, as illustrated in FIG. 1A, and second supporting substrate 105 made of glass is used for again supporting optical waveguide resin layer 103, as illustrated in FIG. 1C.

The use of two supporting substrates requires a working step for stripping optical waveguide resin layer 103 from first supporting substrate 101 as well as a working step for again adhering stripped optical waveguide resin layer 103 to second supporting substrate 105, and a working step for stripping optical waveguide resin layer 103 from second supporting substrate 105. Thus, an additional time required for manufacturing the opto-electric wiring board causes an increase in the manufacturing cost.

Also, in the method of manufacturing an opto-electric wiring board according to the first prior art, thin optical waveguide resin layer 103 is susceptible to deformation into a curled layer when it is stripped from first supporting substrate 101, giving rise to a problem that optical waveguide resin layer 103 is hard to handle during the manufacturing process.

As illustrated in FIG. 1B, thin optical waveguide resin layer 103 is curled when it is stripped from first supporting substrate 101, so that curled optical waveguide resin layer 103 must be reshaped into a flat layer before the step of adhering optical waveguide resin layer 103 to second supporting substrate 105, as illustrated in FIG. 1C. However, a long time is consumed for the adhesion particularly when optical waveguide resin layer 103 is reshaped into a flat layer with difficulties.

The method of manufacturing an optical waveguide according to the second prior art, on the other hand, has a problem of a residual stress produced in the optical waveguide because of the difference in thermal expansion coefficient between materials of the supporting substrate and optical waveguide.

In the method of manufacturing an optical waveguide according to the second prior art, after upper cladding layer 112 is adhered to supporting substrate 111 made of aluminum as illustrated in FIG. 2B, core layer 116 and lower cladding layer 117 each made of a polyimide fluoride film are formed respectively, as illustrated in FIGS. 2C and 2D. The polyimide fluoride film is coated, for example, with a polyamide acid solution, and then thermally treated for imidization. Subsequently, the resulting film is cooled down to a room temperature for curing. As a result, a stress remains in optical waveguide 118 due to a difference in thermal expansion coefficient between aluminum and polyimide fluoride film. The stress makes optical waveguide 118 more susceptible to cracking and the like, resulting in a lower long-term reliability of optical waveguide 118.

SUMMARY OF THE INVENTION

It is therefore an object of the present invention to provide a method of manufacturing an optical waveguide, and a method of manufacturing an opto-electric wiring board which are capable of eliminating a stress remaining in the optical waveguide, and facilitating the handling of the optical waveguide during a manufacturing process to reduce a time required for manufacturing the opto-electric wiring board.

To achieve the above object, a method of manufacturing an opto-electric wiring board according to the present invention adheres an optical waveguide substrate including a supporting substrate on an electric wiring board, and dissolves only the supporting substrate using an organic solvent for removal. Alternatively, a thermal treatment is used to melt only the supporting substrate for removal.

With the foregoing steps, the present invention eliminates any of the working step for stripping the optical waveguide resin layer from the first supporting substrate, the working step for adhering the stripped optical waveguide resin layer again to the second supporting substrate, the working step for stripping the optical waveguide resin layer from the second supporting substrate, and the like, otherwise required in the first prior art. Consequently, a shorter time is required for manufacturing the opto-electric wiring board to reduce the manufacturing cost. In addition, since the thin optical waveguide will not be left alone during the manufacturing, the optical waveguide is free from deformation, resulting in facilitated handling of the optical waveguide.

A method of manufacturing an optical waveguide according to the present invention in turn forms a core layer of an optical waveguide on a supporting substrate using a photosensitive resin having a thermal expansion coefficient substantially identical to that of the supporting substrate.

Since no stress remains in the photosensitive resin even if the optical waveguide is heated during the formation of the core layer, the resulting optical waveguide provides an improved reliability.

The above and other objects, features, and advantages of the present invention will become apparent from the following description with reference to the accompanying drawings which illustrate examples of the present invention.

BRIEF DESCRIPTION OF THE DRAWINGS

FIGS. 3A to 3I are cross-sectional views illustrating a sequence of steps, one by one, in a first embodiment of a method of manufacturing an opto-electric wiring board according to the present invention;

DETAILED DESCRIPTION OF THE PREFERRED EMBODIMENTS (First Embodiment)

FIGS. 3A to 3I are cross-sectional views illustrating a sequence of steps, one by one, in a first embodiment of a method of manufacturing an opto-electric wiring board according to the present invention. In the following, the method of manufacturing an opto-electric wiring board according to the first embodiment will be described with reference to FIGS. 3A to 3I.

Figure 1A:
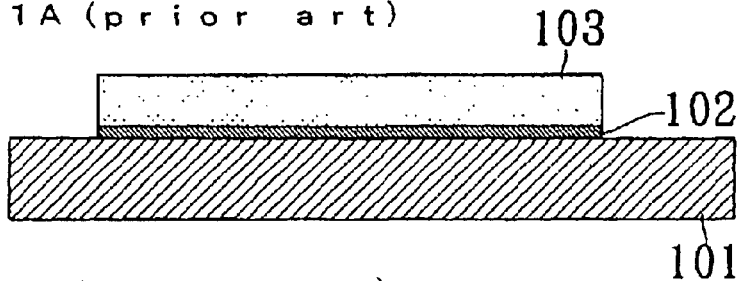
FIGS. 1A to 1E are cross-sectional views illustrating a sequence of steps, one by one, in a method of manufacturing an opto-electric wiring board according to a first prior art.
Figure 1B:
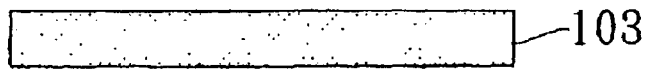
Figure 1C:
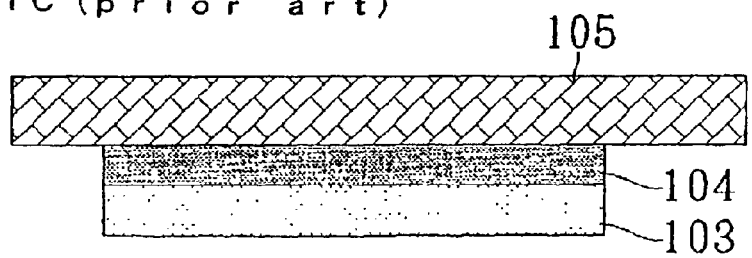
Figure 1D:
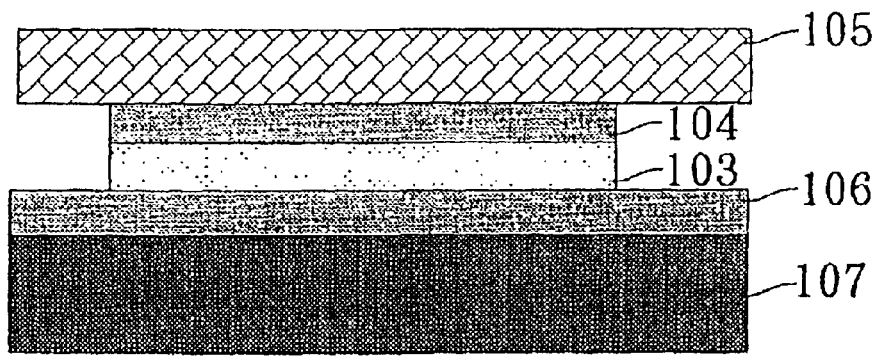
Figure 1E:
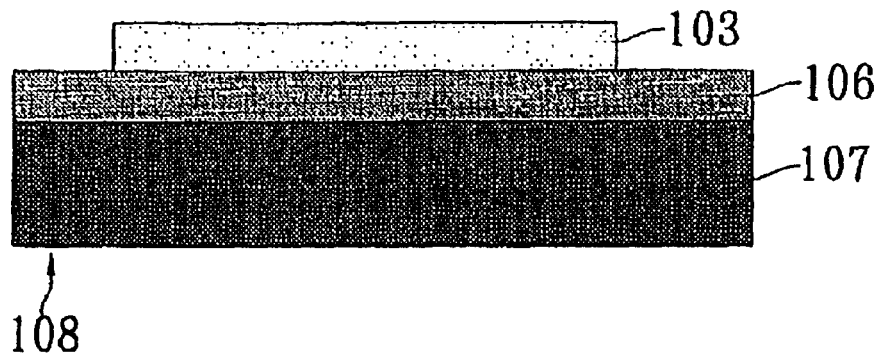
Figure 2A:
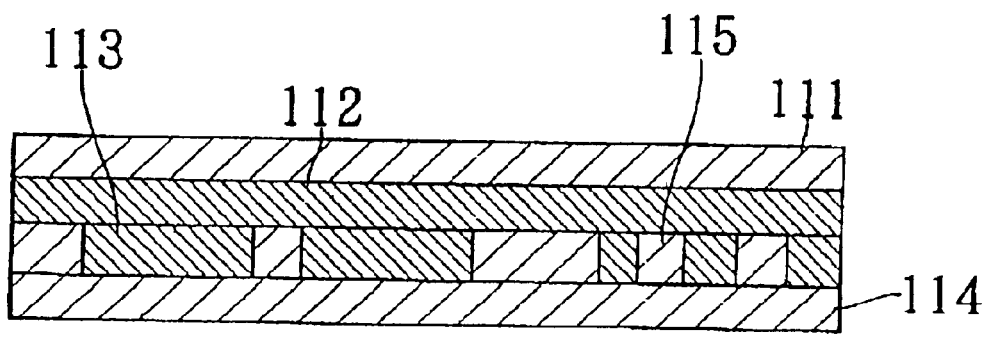
FIGS. 2A to 2D are cross-sectional views illustrating a sequence of steps, one by one, in a method of manufacturing an opto-electric wiring board according to a second prior art.
Figure 2B:
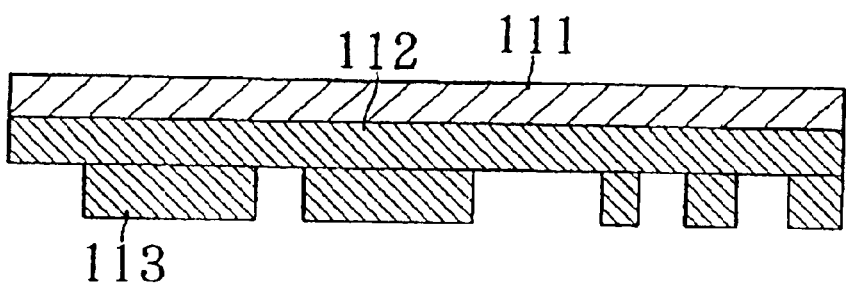
Figure 2C:
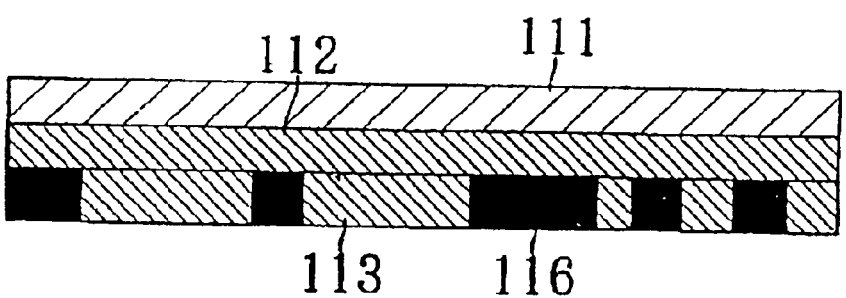
Figure 2D:
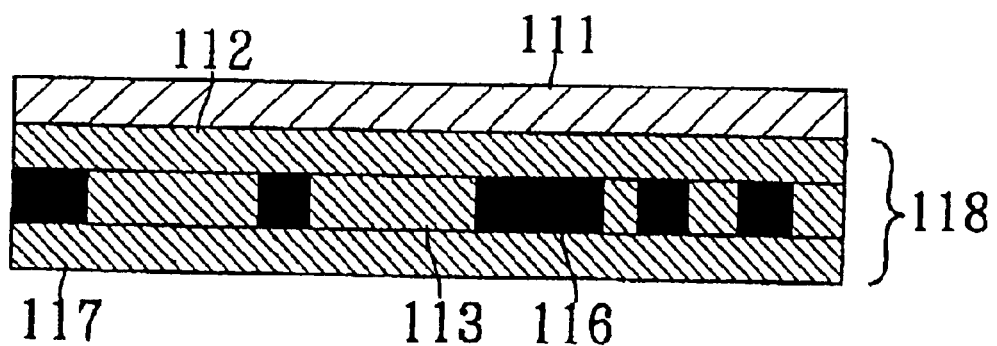
Figure 3A:

In the first embodiment, a thermoplastic polycarbonate resin having a molecular weight in a range of 10,000 to 20,000 is used to form a supporting substrate 1 which is approximately 1 mm thick and in the shape of a square having one side of approximately 300 mm (see FIG. 3A). After an optical waveguide substrate including supporting substrate 1 is adhered to an electric wiring board, later described, supporting substrate 1 is dissolved using an organic solvent such as methylenechloride, tetrachloroethene, chloroform, 1,1,2-trichloroethane, chlorobenzene, dioxane, or the like.

When using supporting substrate 1 made of a polycarbonate resin, one having a molecular weight exceeding approximately 20,000 is dissolved with difficulties using the organic solvents enumerated above. On the other hand, a polycarbonate resin having a molecular weight below approximately 10,000 has a melting point too low to withstand a thermosetting treatment in the manufacturing of an optical waveguide, later described. From the foregoing, a material for supporting substrate 1 is preferably a polycarbonate resin having a molecular weight of approximately 15,000. The polycarbonate resin having a molecular weight of approximately 15,000 exhibits a heat distortion temperature (load distortion temperature) of approximately 120° C. It should be noted that supporting substrate 1 is not limited to the polycarbonate resin as long as it is made of a material which is readily dissolved using the organic solvents enumerated above.

Figure 3B:
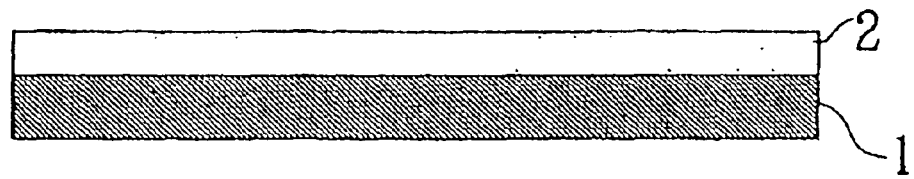

Next, lower cladding layer (first cladding layer) 2 of approximately 20 μm thick is formed on supporting substrate 1 using a thermosetting epoxy resin (see FIG. 3B). Lower cladding layer 2 is made of a material which is not dissolved by the organic solvents enumerated above. Lower cladding layer 2 is formed by coating an epoxy resin solution on supporting substrate 1, and thermosetting the coated epoxy resin solution. In this event, the epoxy resin is thermoset at a temperature equal to or lower than 120° C. which is the heat distortion temperature of supporting substrate 1 (polycarbonate resin). To meet this condition, the epoxy resin is thermoset at approximately 110° C. for 60 minutes in the first embodiment. Lower cladding layer 2 is not limited to the epoxy resin, but an ultraviolet-curing resin may be used instead. In this event, the ultraviolet-curing resin is cured by irradiation with ultraviolet rays at wavelength of 365 nm, for example, with the intensity of 1 to 8 J/cm$^2$ at a room temperature for approximately ten minutes to form lower cladding layer 2.

Figure 3C:
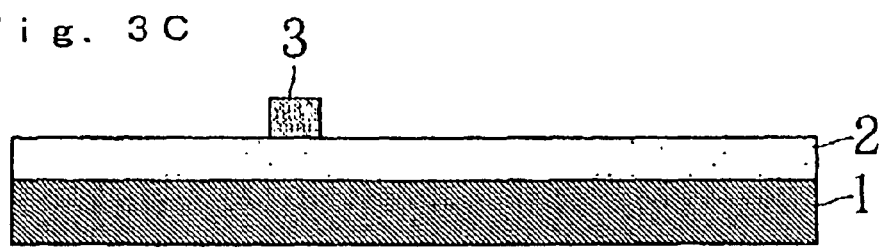

Next, core layer 3 is formed on lower cladding layer 2 using an ultraviolet-curing resin which mainly contains a photosensitive epoxy compound having a larger refractive index than lower cladding layer 2 (see FIG. 3C). Core layer 3 is formed in a thickness of approximately 7 μm when a single mode optical waveguide is formed, and in a thickness of approximately 50 μm when a multi-mode optical waveguide is formed. Core layer 3 is formed by previously coating an ultraviolet-curing resin solution over the whole surface including the top of lower cladding layer 2, and drying it at approximately 110° C. for ten minutes to remove a solvent. Subsequently, ultraviolet rays are irradiated using a mask to cure the ultraviolet-curing resin, thereby patterning the same into a desired shape. Then, the cured ultraviolet-curing resin is thermally treated at approximately 110° C. for 30 minutes, and then cooled down to a room temperature, resulting in the formation of core layer 3.

In the first embodiment, a material chosen for core layer 3 is an ultraviolet-curing resin which has a thermal expansion coefficient substantially identical to that of supporting substrate 1 (polycarbonate resin). Therefore, the ultraviolet-curing resin is contracted in a similar proportion to supporting substrate 1 when the laminate is cooled down to a room temperature from the temperature at which the thermal treatment was conducted, so that core layer 3 can be formed without residual stress. Core layer 3 is not limited to the ultraviolet-curing resin, but any substitute resin may be used as long as it is photosensitive, for example, a photosensitive resin made of photosensitive silicon oligomer. Such a photosensitive resin has a thermal expansion coefficient substantially identical to that of supporting substrate 1.

Figure 3D:
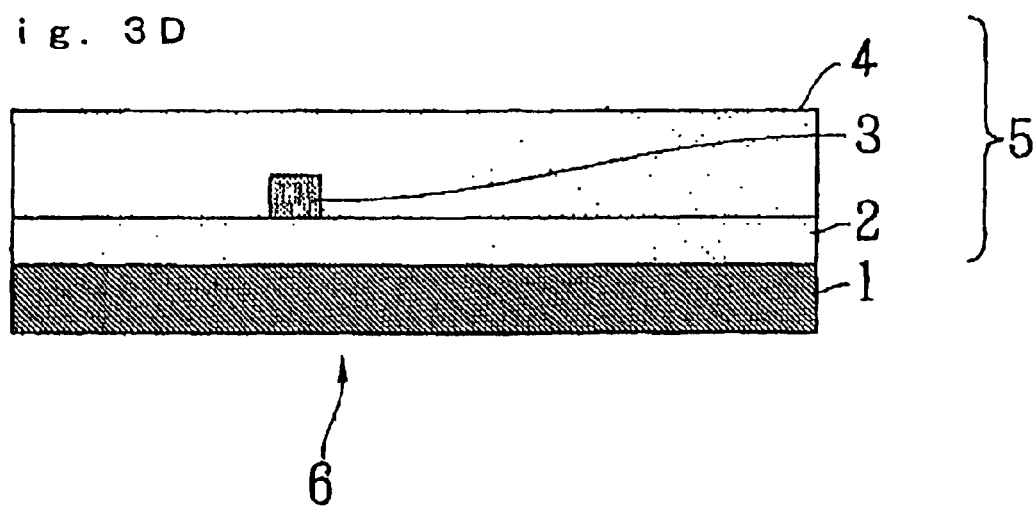

Next, similar to the step illustrated in FIG. 3B, upper cladding layer (second cladding layer) 4 of approximately 20 μm thick is formed over the entire surface including the top of core layer 3 using a thermosetting epoxy resin which has a refractive index smaller than that of core layer 3 (see FIG. 3D). The material for upper cladding layer 4 is not limited to the epoxy resin, as is the case with lower cladding layer 2, but an ultraviolet-curing resin may be used instead.

Manufactured at the end of the foregoing steps is optical waveguide substrate 6 formed with optical waveguide 5 having core layer 3 sandwiched between lower cladding layer 2 and upper cladding layer 4 on supporting substrate 1. Then, optical waveguide substrate 6 including optical waveguide 5 is used in the following manufacturing process to form an opto-electric wiring board.

In the process of manufacturing an opto-electric wiring board, two optical waveguide substrates 6 formed through the steps illustrated in FIGS. 3A to 3D are placed such that both upper cladding layers 4 oppose each other. Electric wiring board 7 has been previously formed using an epoxy resin or a polyimide resin. Electric wiring board 7 has a thickness of approximately 1 mm and is formed with electric wires (not shown) and throughhole contacts, later described, on the surfaces. Electric wiring board 7 is sandwiched between two optical waveguide substrates 6 for integration into a single board (see FIG. 3E).

Specifically, an adhesive made of a cold-setting epoxy resin is coated on both sides of electric wiring board 7 or on upper cladding layers 4 in a vacuum atmosphere. Then, the resulting laminate is pressurized from both sides using a pair of vacuum press plates 8 on a vacuum press machine to cure the epoxy resin adhesive at a room temperature, thereby integrating two optical waveguide substrates 6 with electric wiring board 7 through adhesion. Alternatively, an adhesive made of an ultraviolet-curing epoxy resin may be used instead of the adhesive made of the cold-setting epoxy resin. In this event, the adhesive made of the ultraviolet-curing epoxy resin is irradiated with ultraviolet rays for adhering optical waveguide substrates 6 with electric wiring board 7.

Figure 3E:
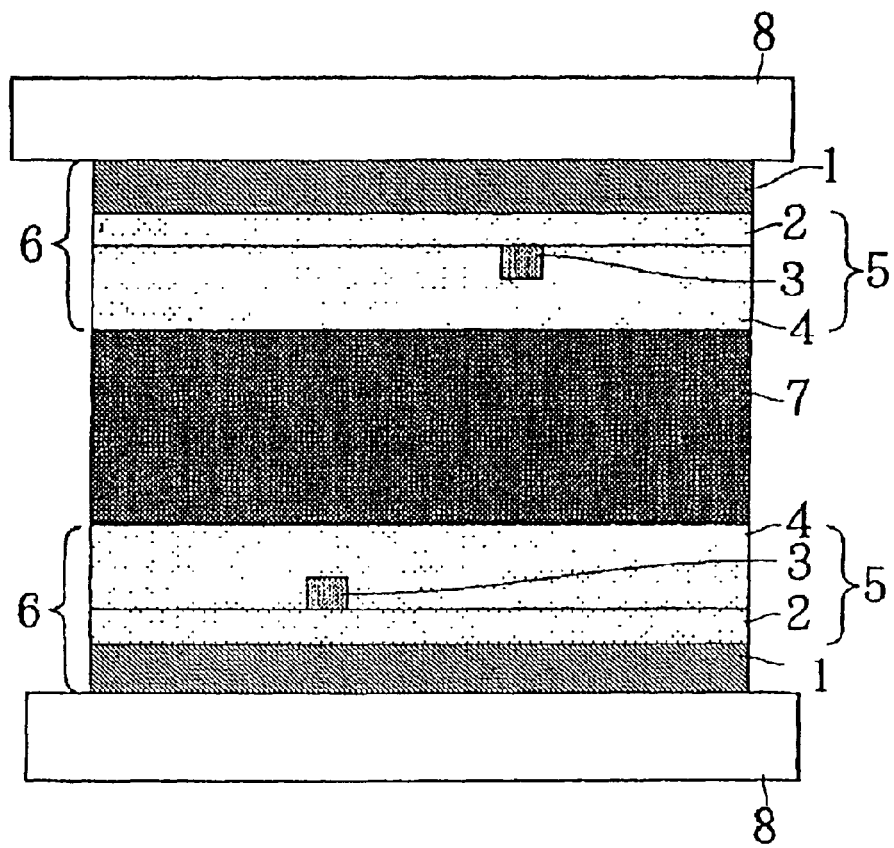
Figure 3F:
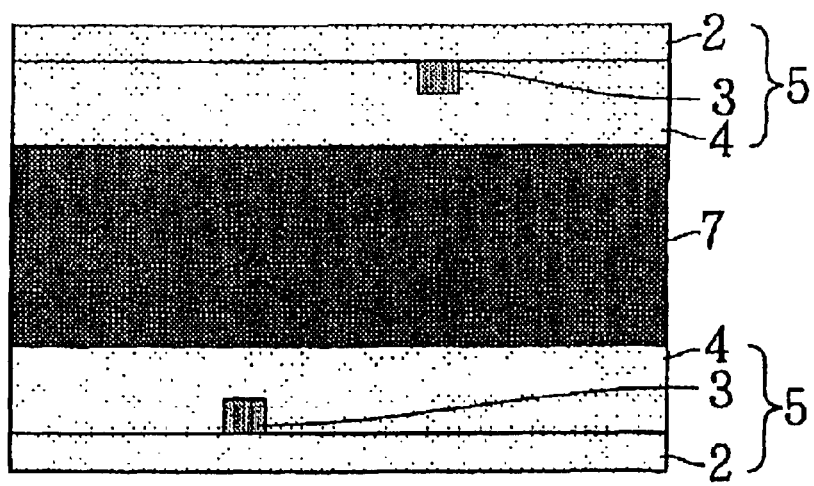

Next, after vacuum press plates 8 are removed from the resulting laminate, supporting substrates 1 of optical waveguide substrates 6 are respectively dissolved for removal using any of the various organic solvents enumerated above, resulting in a main portion of the opto-electric wiring board which has optical waveguides 5 adhered on both sides of electric wiring board 7 (see FIG. 3F). Here, for removing supporting substrates 1, they may be mechanically polished while they are dissolved with an organic solvent.

As described above, since the organic solvent is made of a material which dissolves only supporting substrate 1, supporting substrate 1 alone can be removed without adverse effects on upper cladding layer 2, core layer 3 or lower cladding layer 4.

Figure 3G:
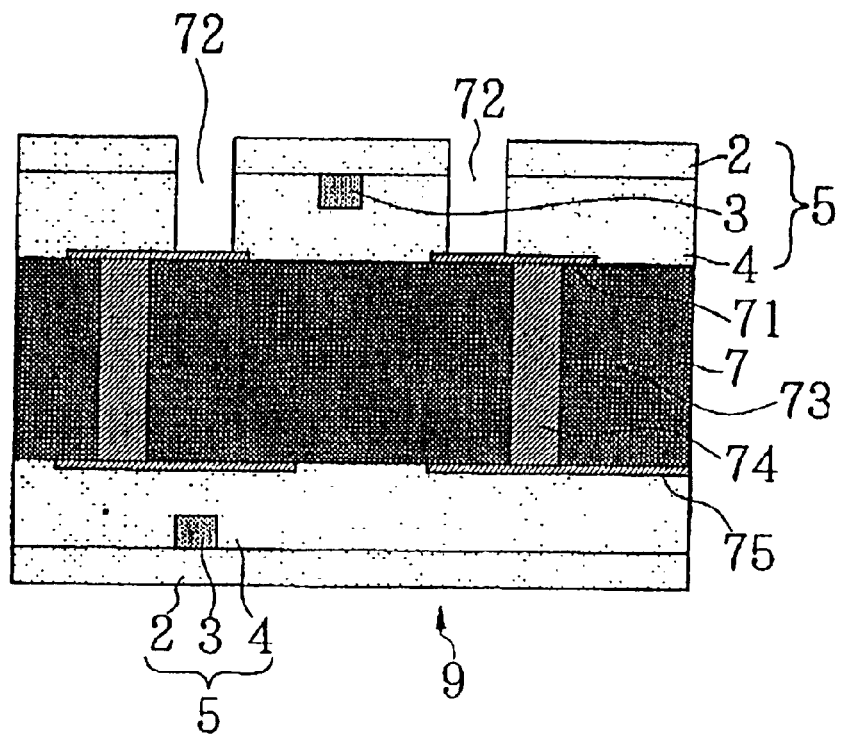

Next, part terminal connection holes 72 are formed using a machining means such as a laser, a drill, or the like from lower cladding layer 2 of one optical waveguide 5 (upper one in FIG. 3G in the first embodiment) to electric wire 71 of electric wiring board 7, to complete opto-electric wiring board 9 (see FIG. 3G). Assume that electric wiring board 7 has been formed with electric wires 71, 75 which electrically connect to throughhole contacts 74 embedded in via holes 73 at upper and lower ends of respective via holes 73.

Figure 3H:
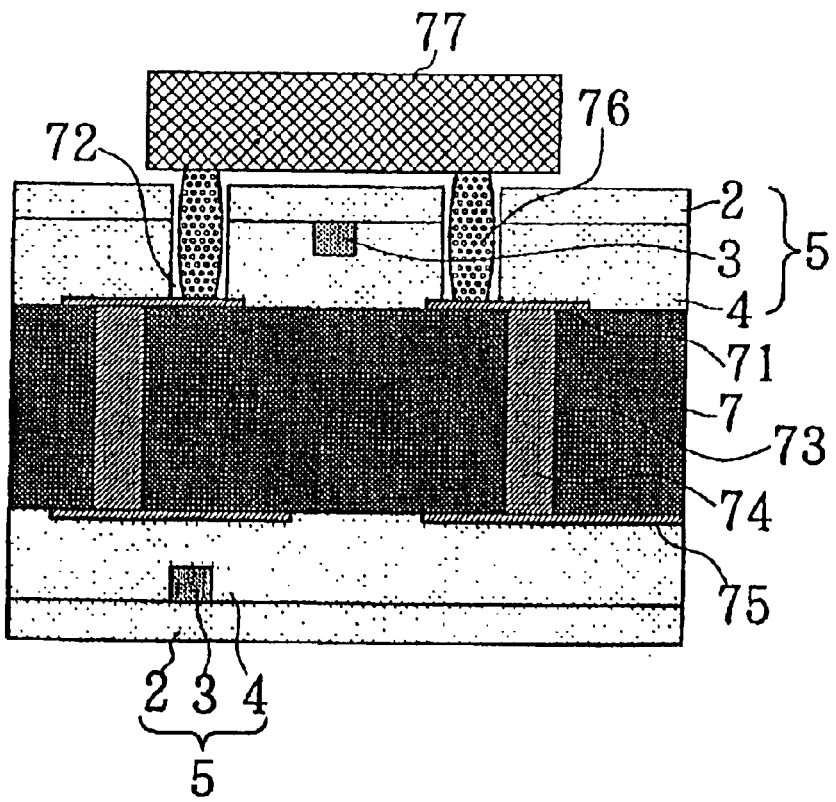
Figure 31:
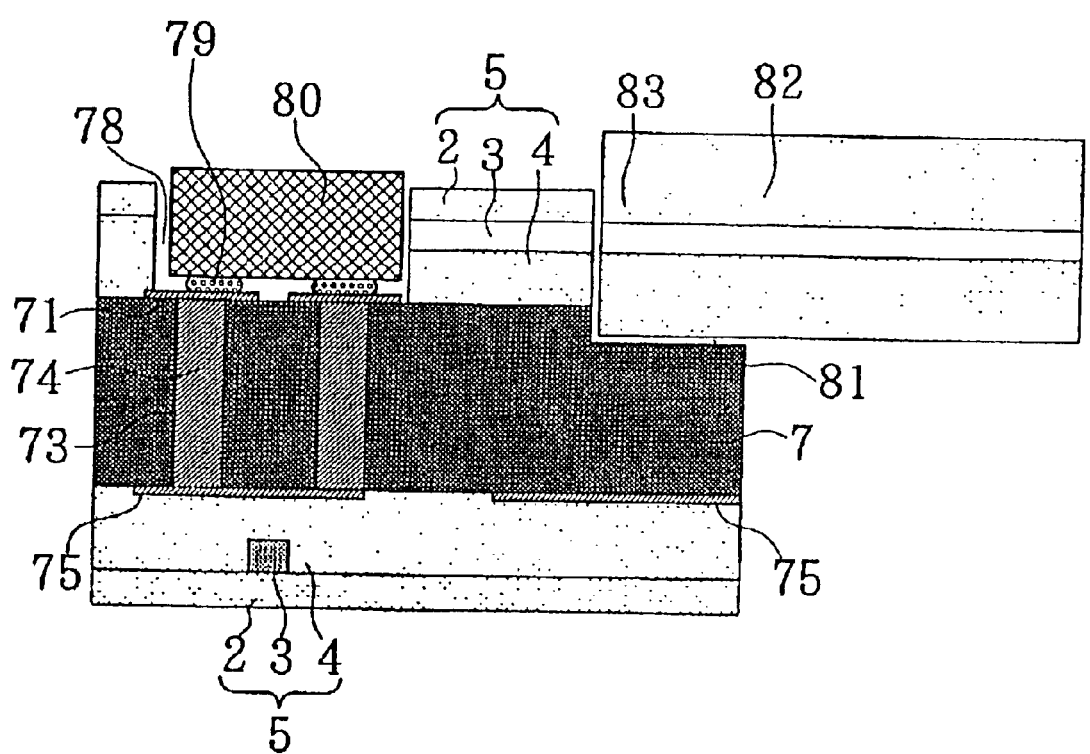

Finally, electric part 77 comprising terminals 76 such as bumps, conductive columns or the like is mounted on optical waveguide 5 such that terminals 76 are connected to electric wire 71 through connection holes 72 (see FIG. 3H). Alternatively, as illustrated in FIG. 3I, one of optical waveguides 5 is removed to expose a portion of electric wire 71 to form opening 78, and light emitting component 80 such as a laser diode, comprising terminals 79, is mounted on electric wiring board 7 such that terminals 79 are connected to electric wire 71 through opening 78, and the optical axis of a light emitter is in alignment with the optical axis of core layer 3 which is exposed on a side face of opening 78. Then, V-shaped groove 81 is formed at a different location on electric wiring board 7, and optical fiber 82 is mounted in V-shaped groove 81 such that its optical axis is in alignment with the optical axis of optical waveguide 5.

In the first embodiment, the following manufacturing steps may be employed other than the manufacturing steps described above.

Specifically, prior to the manufacturing step illustrated in FIG. 3E, electric parts are previously mounted on electric wiring board 7, and optical waveguides 5 and supporting substrates 1 of optical waveguide substrates 6 are partially removed at corresponding locations at which the electronic parts are mounted on electric wiring board 7. Then, electric wiring board 7 is adhered to optical waveguide substrates 6 in a manner similar to the manufacturing step illustrated in FIG. 3E to complete opto-electric wiring board 7.

Alternatively, electric wiring board 7 may be previously mounted with electronic parts which are embedded therein. Optical waveguide substrates 6 may be adhered on both sides of this electric wiring board 7 to manufacture opto-electric wiring board 9.

According to the method of manufacturing the opto-electric wiring board in the first embodiment, supporting substrates 1 of optical waveguide substrates 6 are dissolved alone for removal using an organic solvent after previously manufactured optical waveguide substrates 6 have been adhered on electric wiring board 7, thus eliminating any of the working step for stripping the optical waveguide resin layer from the first supporting substrate, the working step for adhering the stripped optical waveguide resin layer again to the second supporting substrate, the working step for stripping the optical waveguide resin layer from the second supporting substrate, and the like, as required in the first prior art. Consequently, a shorter time is required for manufacturing the opto-electric wiring board to reduce the manufacturing cost.

Also, core layer 3 is formed on supporting substrate 1 made of a polycarbonate resin using an ultraviolet-curing resin or a photosensitive resin made of photosensitive silicon oligomer, having the thermal expansion coefficient substantially identical to that of supporting substrate 1. Since the photosensitive resin contracts substantially in the same proportion as supporting substrate 1 when the laminate is cooled down to a room temperature from the thermosetting temperature, core layer 3 can be formed without any stress remaining in the photosensitive resin. Thus, unlike the second prior art, optical waveguide 118 is free from a residual stress which would be otherwise produced due to the difference in thermal expansion coefficient between supporting substrate 1 and optical waveguide 118. Consequently, since the optical waveguide is less susceptible to cracking and the like, the optical waveguide provides an improved long-term reliability. In addition, since the elimination of residual stress results in a reduced difference in refractive index due to a difference in polarizing direction which has been inevitable due to the residual stress, the resulting optical waveguide provides an improved optical transmission characteristic.

Further, according to the method of manufacturing the optical waveguide in the first embodiment, since optical waveguide 5 is adhered to electric wiring board 7 without being removed from supporting substrate 1, optical waveguide 5 even having a small thickness will not be deformed or curled. This results in the elimination of additional working steps otherwise required for reshaping optical waveguide 5 into a flat sheet, facilitating the handling of optical waveguide 5 in the process of manufacturing the opto-electric wiring board.

(Second Embodiment)

FIGS. 4A to 4F are cross-sectional views illustrating a sequence of steps, one by one, in a second embodiment of a method of manufacturing an opto-electric wiring board according to the present invention.

The method of manufacturing an opto-electric wiring board according to the second embodiment differs from the first embodiment in that the former employs a supporting substrate which has a higher heat distortion temperature.

In the following, the method of manufacturing an opto-electric wiring board according to the second embodiment will be described with reference to FIGS. 4A to 4F.

Figure 4A:
FIGS. 4A to 4F are cross-sectional views illustrating a sequence of steps, one by one, in a second embodiment of a method of manufacturing an opto-electric wiring board according to the present invention.

In the second embodiment, a thermoplastic polyphenylene sulfide (PPS) resin is used to form supporting substrate 11 which is approximately 1 mm thick and in the shape of a square having one side of approximately 300 mm (see FIG. 4A). The PPS resin is a crystalline polymer which exhibits a heat distortion temperature of approximately 260° C. near its melting point (approximately 280° C.), and is therefore highly heat-resistant.

The material for supporting substrate 11 is not limited to the PPS resin mentioned above, but may be a thermoplastic resin having a heat distortion temperature of 200° C. or higher, such as polyetherimide, polyethersulphone, syndiotactic polystyrene, polysulphone, polyarylate, polyphenyleneether, or the like.

Figure 4B:
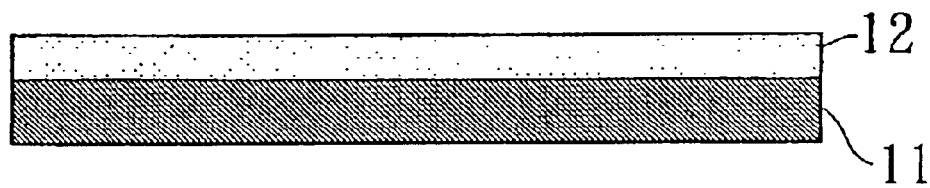

Next, lower cladding layer (first cladding layer) 12 of approximately 20 μm thick is formed on supporting substrate 11 using a thermosetting epoxy resin (see FIG. 4B). Lower cladding layer 12 is formed by coating an epoxy resin solution having, for example, a fluorene structure on supporting substrate 11, and thermosetting the epoxy resin at temperatures ranging from 160 to 200° C. As described above, supporting substrate 11 made of the PPS resin exhibits the heat distortion temperature of approximately 260° C. which is higher than the temperature at which lower cladding layer 12 is thermoset. Thus, supporting substrate 11 can sufficiently withstand the thermosetting temperature and is free from thermal deformation. Also, since the thermosetting resin comprises an epoxy resin having a thermal expansion coefficient substantially identical to that of supporting substrate 11, the epoxy resin contracts substantially in the same proportion as supporting substrate 11 when the laminate is cooled down to a room temperature from the thermosetting temperature. For this reason, lower cladding layer 12 can be formed without any stress remaining in the epoxy resin.

Figure 4C:
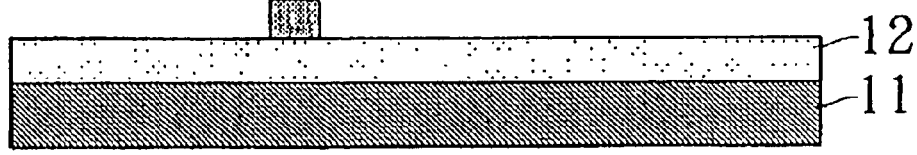

Next, core layer 13 is formed on lower cladding layer 12 using a photosensitive alkali soluble epoxy resin having a refractive index larger than that of lower cladding layer 12 and having, for example, a fluorene structure (see FIG. 4C).

Core layer 13 is formed in a similar thickness to that in the first embodiment. Core layer 13 is formed by previously coating an epoxy resin solution over the entire surface including the top of lower cladding layer 12, and drying it at approximately 110° C. for ten minutes to remove a solvent contained therein. Subsequently, the resulting epoxy resin layer is patterned into a desired shape through development. Then, the patterned epoxy resin layer is thermally treated at temperatures ranging from 160 to 200° C. and cooled down to a room temperature, resulting in the formation of core layer 13.

Since the epoxy resin used to form core layer 13 has a thermal expansion coefficient similar to that of supporting substrate 11 made of the PPS resin, the epoxy resin contracts in a similar proportion to supporting substrate 11 when they are cooled down to a room temperature from the thermosetting temperature. Core layer 13 can therefore be formed without any stress remaining in the epoxy resin.

Subsequently, similar to the manufacturing step illustrated in FIG. 4B, upper cladding layer (second cladding layer) 14 of approximately 20 μm thick is formed over the entire surface including the top of core layer 13 using a thermosetting epoxy resin having a refractive index smaller than that of core layer 13 (see FIG. 4D). The material for upper cladding layer 14 is not limited to the epoxy resin having a fluorene structure, but may be a transparent thermosetting resin or ultraviolet-curing resin, as is the case with lower cladding layer 12.

Manufactured at the end of the steps described above is optical waveguide substrate 61 formed with optical waveguide 15 having core layer 13 sandwiched between lower cladding layer 12 and upper cladding layer 14 on supporting substrate 11. Then, optical waveguide substrate 16 including optical waveguide 15 is used in the following manufacturing process to form an opto-electric wiring board.

In the process of manufacturing an opto-electric wiring board, two optical waveguide substrates 16 formed through the steps illustrated in FIGS. 4A to 4D are placed such that both upper cladding layers 14 oppose each other. Electric wiring board 17 has been previously formed using an epoxy resin or a polyimide resin. Electric wiring board 17 has a thickness of approximately 1 mm and is formed with electric wires (not shown) and throughhole contacts, later described, on the surfaces. Electric wiring board 17 is sandwiched between two optical waveguide substrates 16 for integration into a single board (see FIG. 4E).

Specifically, an adhesive made of a cold-setting epoxy resin is coated on both sides of electric wiring board 17 or on upper cladding layers 14 in a vacuum atmosphere. Then, the resulting laminate is pressurized from both sides using a pair of vacuum press plates 18 on a vacuum press machine to cure the epoxy resin adhesive at a room temperature, thereby integrating two optical waveguide substrates 16 with electric wiring board 17 through adhesion. Alternatively, an adhesive made of ultraviolet-curing epoxy resin may be used instead of the adhesive made of the cold-setting epoxy resin. In this event, the adhesive made of the ultraviolet-curing epoxy resin is irradiated with ultraviolet rays for curing to adhere optical waveguide substrates 16 with electric wiring board 17.

Figure 4D:
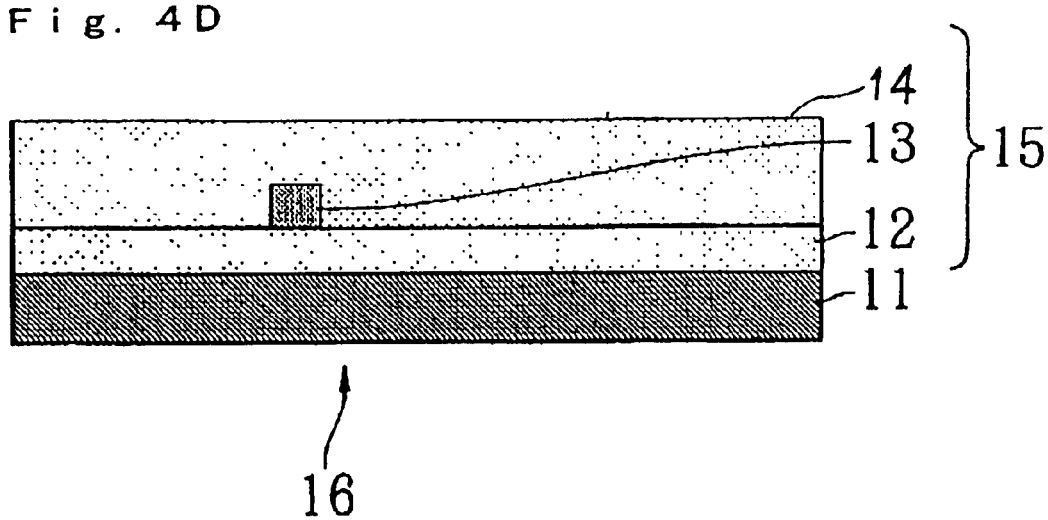
Figure 4E:
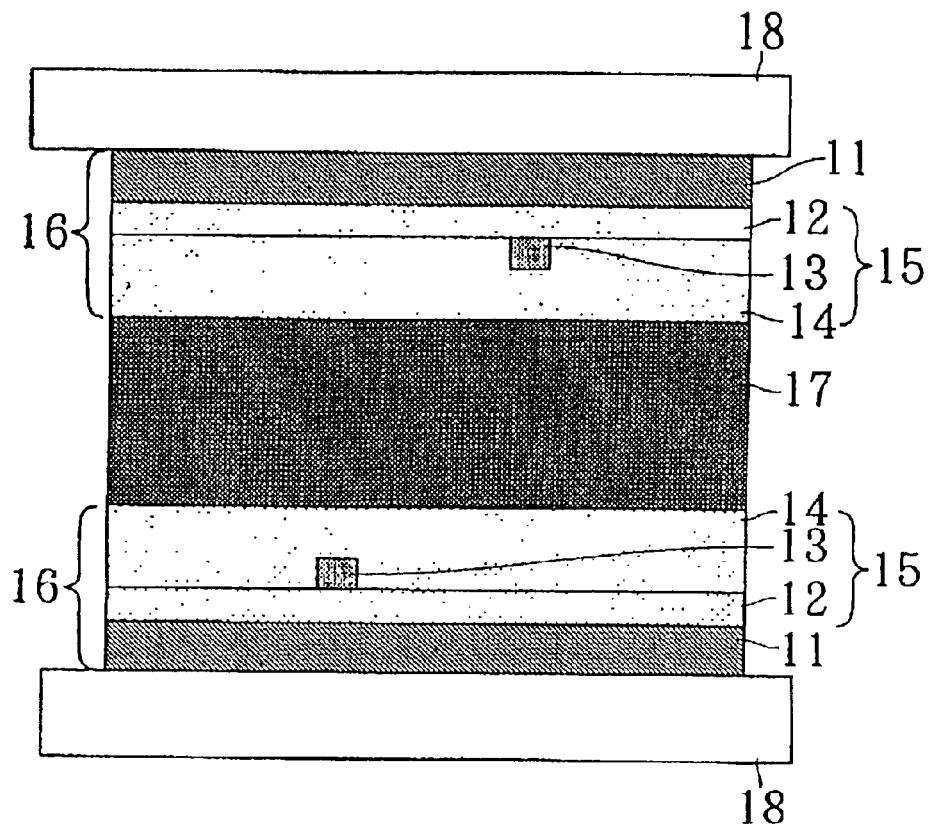
Figure 4F:
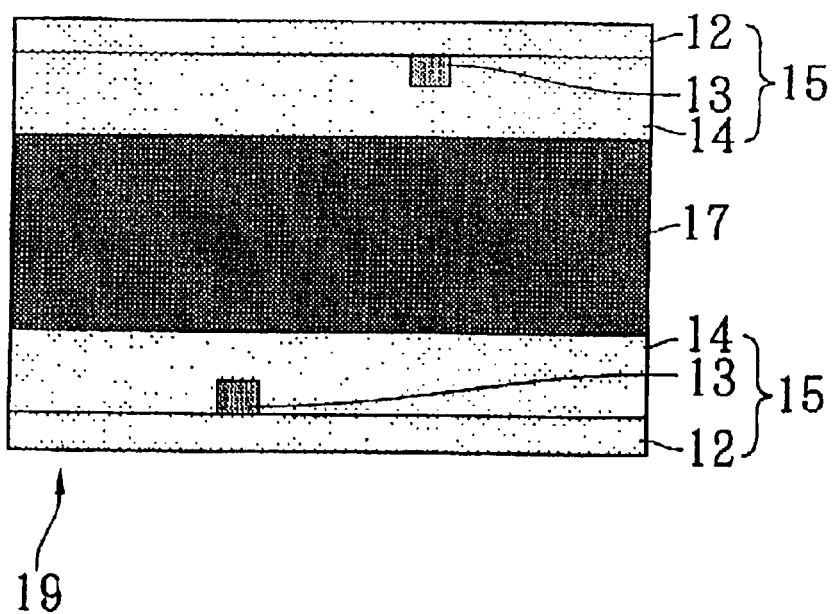

Next, after vacuum press plates 18 are removed from the resulting laminate, the laminate is thermally treated at approximately 260° C. or higher to melt or soften supporting substrates 11 made of the PPS resin for removal, resulting in a main portion of the opto-electric wiring board which has optical waveguides 15 adhered on both sides of electric wiring board 17 (see FIG. 4F). Here, for removing supporting substrates 11, they 11 may be mechanically polished for removal using a polishing tool heated to the heat distortion temperature near 260° C. or higher. In this event, even if the laminate is heated to approximately 260° C., which is the heat distortion temperature of the PPS resin comprising supporting substrate 11, or higher, optical waveguides 15 are prevented from deterioration because supporting substrates 11 alone are heated, whereas upper cladding layers 12, core layers 13 and lower cladding layers 14 of optical waveguides 15 are not affected so much by the heating.

Finally, like the first embodiment, part terminal connection holes are formed using a machining means such as a laser, a drill, or the like from lower cladding layer 12 of one optical waveguide 15 (upper one in FIG. 4F in the second embodiment) to an electric wire of electric wiring board 17, to complete opto-electric wiring board 19.

According to the method of manufacturing the opto-electric wiring board in the second embodiment, after previously manufactured optical waveguide substrates 16 are adhered on both sides of electric wiring board 17, the resulting laminate is heated to the melting point or higher of the PPS resin of supporting substrate 11 contained in optical waveguides 15 to melt or soften supporting substrates 11 alone for removal, thus eliminating any of the working step for stripping the optical waveguide resin layer from the first supporting substrate, the working step for adhering the stripped optical waveguide resin layer again to the second supporting substrate, the working step for stripping the optical waveguide resin layer from the second supporting substrate, and the like, as required in the first prior art. Consequently, a shorter time is required for manufacturing the opto-electric wiring board to reduce the manufacturing cost.

Also, since supporting substrate 11 used in the second embodiment is made of a thermoplastic resin having a heat distortion temperature of approximately 200° C. or higher, the thermosetting resin or photosensitive resin used to form optical waveguide 15 can be thermoset at a higher temperature, so that these resins can be sufficiently thermoset. The optical waveguide manufactured in this manner can provide a high reliability.

Also, according to the method of manufacturing the optical waveguide in the second embodiment, core layer 13 is formed on supporting substrate 11 made of the PPS resin using a photosensitive epoxy resin having the thermal expansion coefficient substantially identical to that of supporting substrate 11, so that the resulting optical waveguide is free from a residual stress which would be produced in the second prior art. Consequently, since the optical waveguide is less susceptible to cracking and the like, the optical waveguide provides an improved long-term reliability. In addition, since the elimination of residual stress results in a reduced difference in refractive index due to a difference in polarizing direction which has been inevitable due to the residual stress, the optical waveguide provides an improved optical transmission characteristic.

Further, since optical waveguide 15 is adhered to electric wiring board 17 without being removed from supporting substrate 11, optical waveguide 15 even having a small thickness will not be deformed or curled. This results in the elimination of additional working steps otherwise required for reshaping optical waveguide 15 into a flat sheet, facilitating the handling of optical waveguide 15 in the process of manufacturing the opto-electric wiring board.

As appreciated from the foregoing, the second embodiment can also provide similar advantages to the first embodiment.

(Third Embodiment)

FIGS. 5A to 5H are cross-sectional views illustrating a sequence of steps, one by one, in a third embodiment of a method of manufacturing an opto-electric wiring board according to the present invention.

The method of manufacturing an opto-electric wiring board according to the third embodiment differs from the first embodiment in that electric wires routed on the opto-electric wiring board have a certain degree of freedom.

In the following, the method of manufacturing an opto-electric wiring board according to the third embodiment will be described with reference to FIGS. 5A to 5H.

Figure 5A:
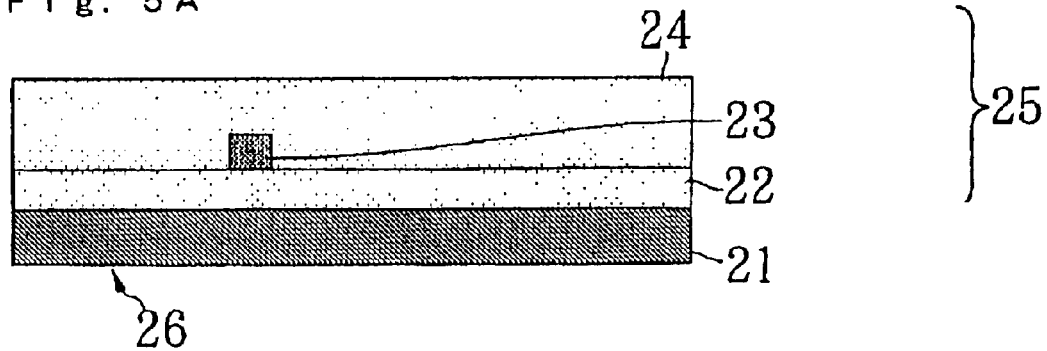
FIGS. 5A to 5H are cross-sectional views illustrating a sequence of steps, one by one, in a third embodiment of a method of manufacturing an opto-electric wiring board according to the present invention.
Figure 5B:
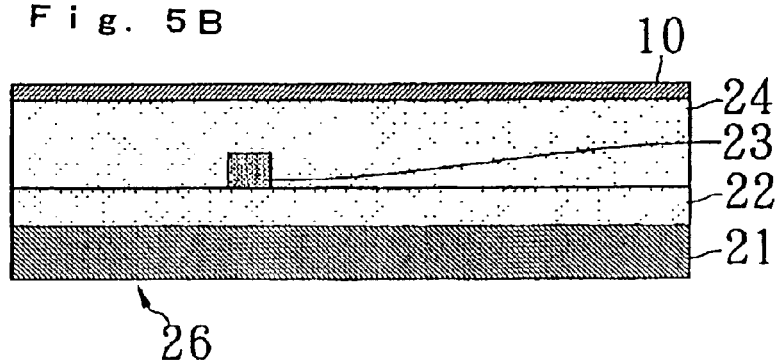

In the third embodiment, first, optical waveguide 25 having core layer 23 between lower cladding layer 22 and upper cladding layer 24 is formed on supporting substrate 21 through steps similar to those in the first embodiment illustrated in FIGS. 3A to 3D to complete optical waveguide substrate 26 illustrated in FIG. 5A. This optical waveguide substrate 26 further undergoes predetermined processing on its surface through the manufacturing steps described below.

First, the surface of upper cladding layer 24 is planarized through processing such as mechanical polishing, hot pressing, or the like. Next, the planarized surface of upper cladding layer 24 is dissolved for roughening using an oxidizing agent such as a chromate solution, a potassium permanganate solution, or the like.

Next, after a Pd (paradium) catalyst is coated on the surface of upper cladding layer 24, a first metal plating layer of approximately 1 μm thick is formed by an electroless copper plating method using an electroless copper plating solution. A second metal plating layer of approximately 18 μm thick is further formed on the first metal plating layer by an electrolytic plating method, thereby forming metal plating layer 10 having a total thickness of 19 μm (see FIG. 5B).

Subsequently, a photoresist film is covered over the entire surface of metal plating layer 10 except for unnecessary portions using a known photolithography technique. Then, metal plating layer 10 is dry etched or wet etched using the photoresist film as a mask to remove unnecessary portions of metal plating layer 10, thereby patterning metal plating layer 10 into a desired shape (see FIG. 5C). Metal plating layer 10 is used as a first electric wire on the opto-electric wiring board.

Figure 5C:
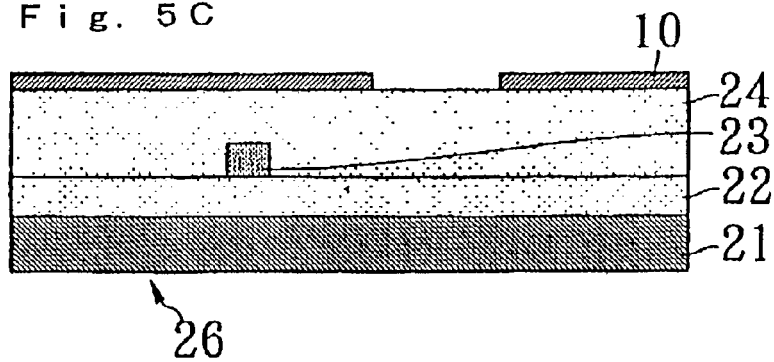
Figure 5D:
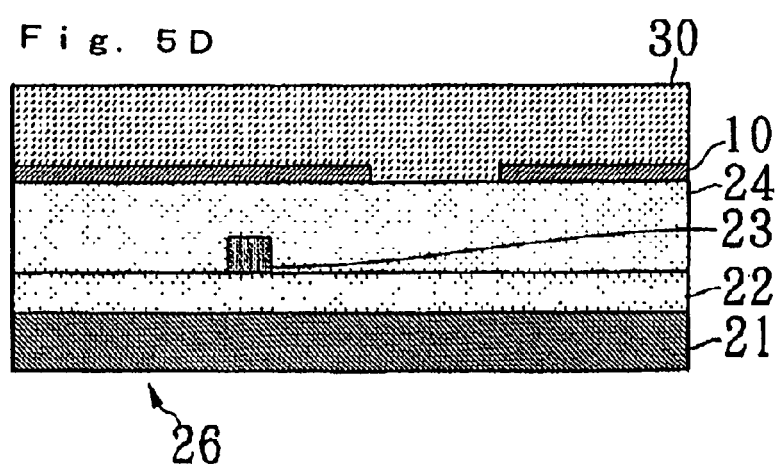

Next, buffer resin layer 30 of approximately 50 μm thick is formed over the entire surface including the top of metal plating layer 10 using a thermosetting epoxy resin (see FIG. 5D). Buffer resin layer 30 is formed by previously coating an epoxy resin solution over the entire surface, thermosetting the epoxy resin at approximately 150° C. for approximately two hours, and then cooling down the laminate to a room temperature. This thermosetting temperature is higher than the heat distortion temperature (approximately 120° C.) of the polycarbonate resin which comprises supporting substrate 21. However, since buffer resin layer 30 functions as a supporting substrate, optical waveguide substrate 26 is free from thermal deformation. Therefore, metal plating layer 10 formed on the surface of upper cladding layer 24 is not susceptible to disconnection.

Manufactured at the end of the steps described above is optical waveguide substrate 26 formed with optical waveguide 25 having core layer 23 sandwiched between lower cladding layer 22 and upper cladding layer 24, as well as metal plating layer 10 and buffer resin layer 30 on the surface of optical waveguide 25. Then, optical waveguide substrate 26 including optical waveguide 25 is used in the following manufacturing process to form an opto-electric wiring board.

In the process of manufacturing an opto-electric wiring board, two optical waveguide substrates 26 formed through the steps illustrated in FIGS. 5A to 5D are placed such that both buffer layers 30 oppose each other. Electric wiring board 27 has been previously formed using an epoxy resin or a polyimide resin. Electric wiring board 27 has a thickness of approximately 1 mm and is formed with electric wires (not shown) and throughhole contacts, later described, on the surfaces. Electric wiring board 27 is sandwiched between two optical waveguide substrates 26 for integration into a single board (see FIG. 5E).

Specifically, an adhesive made of a cold-setting epoxy resin is coated on electric wiring board 27 or buffer resin layer 30 in a vacuum atmosphere. Then, the resulting laminate is pressurized from both sides using a pair of vacuum press plates 28 on a vacuum press machine to cure the epoxy resin adhesive at a room temperature, thereby integrating two optical waveguide substrates 26 with electric wiring board 27 through adhesion. In this event, since metal plating layer 10 formed on upper cladding layer 24 is in contact with buffer resin layer 30, metal plating layer 10 is protected by buffer resin layer 30 from multi-layered wiring on electric wiring board 27, and is therefore free from deformation or disconnection.

Figure 5E:
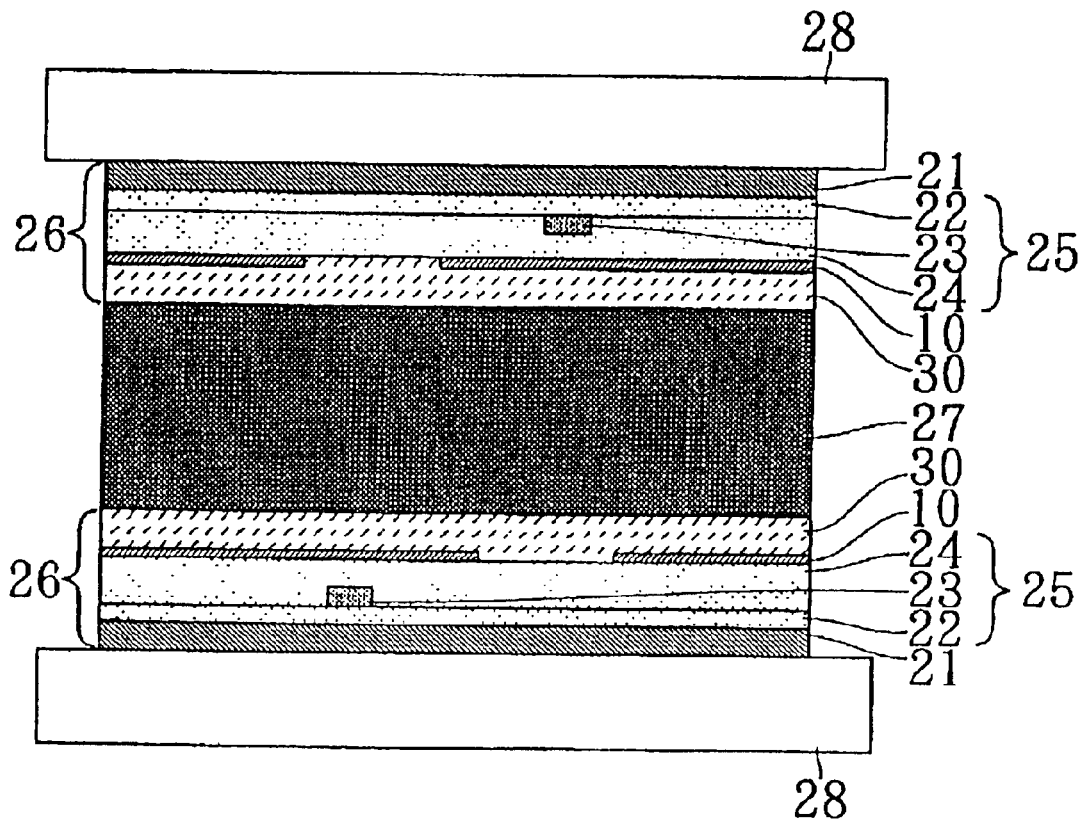
Figure 5F:
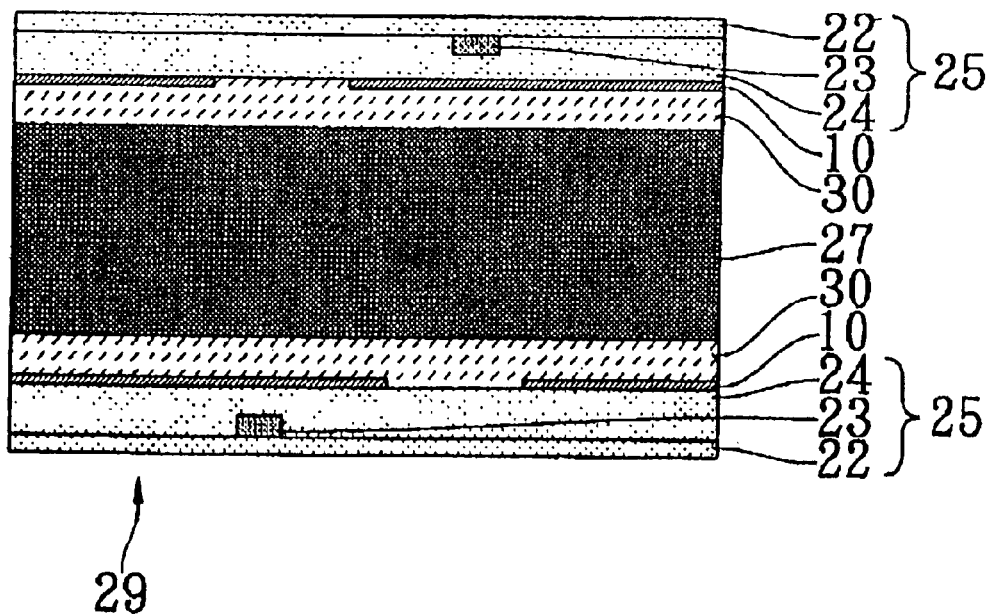

Next, after vacuum press plates 28 are removed from the resulting laminate, supporting substrates 21 of optical waveguide substrates 26 are respectively dissolved for removal using any of the various organic solvents enumerated above, i.e., methylenechloride, tetrachloroethene, chloroform, 1,1,2-trichloroethane, chlorobenzene, dioxane, or the like, resulting in a main portion of opto-electric wiring board 29 which has optical waveguides 25, adhered on both sides of electric wiring board 27 (see FIG. 5F). Here, for removing supporting substrates 21, they may be mechanically polished while they are dissolved with an organic solvent. As described above, since the organic solvent is made of a material which dissolves only supporting substrate 21, supporting substrates 21 alone can be removed without adverse effects on upper cladding layer 22, core layer 23 or lower cladding layer 24.

Figure 5G:
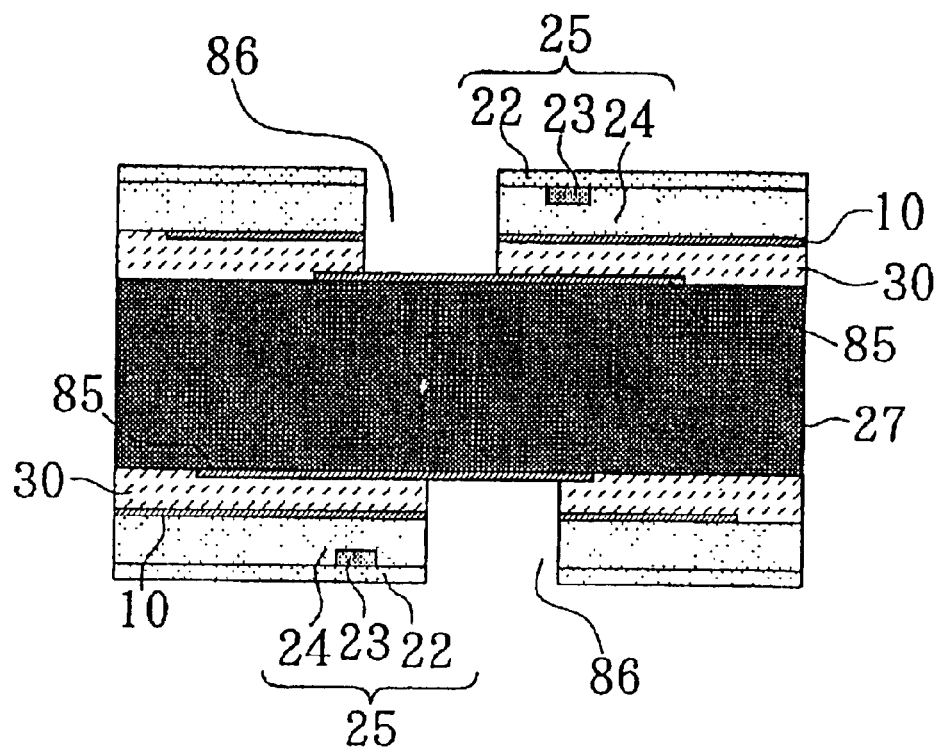

Next, part terminal connection holes 86 are formed using a machining means such as a laser, a drill, or the like from a lower cladding layer 22 of optical waveguide 25 to electric wire 85 of electric wiring board 27, to complete opto-electric wiring board 29 (see FIG. 5G).

Figure 5H:
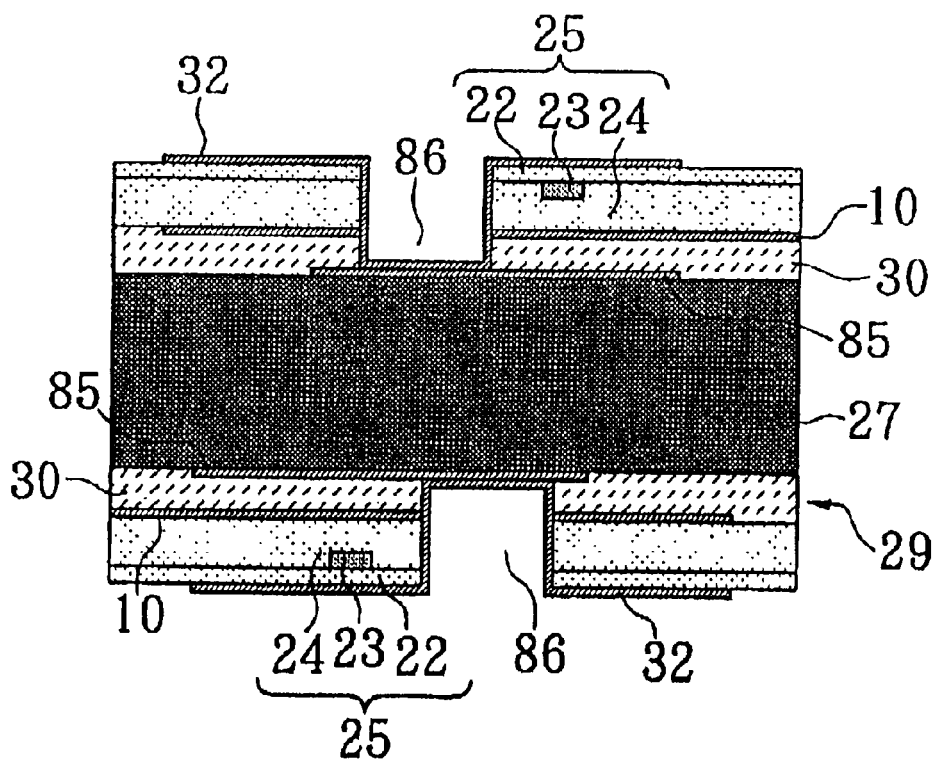

Finally, after a copper plating layer is formed over the entire surface including part terminal connection holes 86, patterned metal plating layer 32 is formed using a known photolithography technique for connecting electric wire 85 with metal plating layer 10 (see FIG. 5H). This metal plating layer 32 is used as a second electric wire of optical waveguide 25.

According to the method of manufacturing the opto-electric wiring board in the third embodiment, after previously manufactured optical waveguide substrates 26 are adhered to electric wiring board 27, supporting substrates 21 of optical waveguide substrates 26 alone are dissolved with an organic solvent for removal, thereby eliminating any of the working steps for stripping the optical waveguide resin layer from the first supporting substrate, the working step for adhering the stripped optical waveguide resin layer again to the second supporting substrate, the working step for stripping the optical waveguide resin layer from the second supporting substrate, and the like, as required in the first prior art. Consequently, a shorter time is required for manufacturing the opto-electric wiring board to reduce the manufacturing cost.

Also, core layer 23 is formed on supporting substrate 21 made of a polycarbonate resin using an ultraviolet-curing resin or a photosensitive resin made of photosensitive silicon oligomer which has the thermal expansion coefficient substantially identical to that of supporting substrate 21. Since the photosensitive resin contracts in a similar proportion to supporting substrate 21 when the laminate is cooled down to a room temperature from the thermosetting temperature, core layer 23 can be formed without any stress remaining in the photosensitive resin. Thus, unlike the second prior art, the optical waveguide is free from a residual stress which would be otherwise produced due to the difference in thermal expansion coefficient between the supporting substrate and optical waveguide. Consequently, since the optical waveguide is less susceptible to cracking and the like, the optical waveguide provides an improved long-term reliability. In addition, since the elimination of residual stress results in a reduced difference in refractive index due to a difference in polarizing direction which has been inevitable due to the residual stress, the optical waveguide provides an improved optical transmission characteristic.

Further, since optical waveguide 25 is adhered to electric wiring board 27 without being removed from supporting substrate 21, optical waveguide 25 even having a small thickness will not be deformed or curled. This results in the elimination of additional working steps otherwise required for reshaping optical waveguide 25 into a flat sheet, facilitating the handling of optical waveguide 25 in the process of manufacturing the opto-electric wiring board.

As appreciated from the foregoing, the third embodiment can also provide similar advantages to the first embodiment.

Particularly, according to the method of manufacturing the opto-electric wiring board in the third embodiment, after electric wiring board 27 is sandwiched between optical waveguides 25 each previously formed with metal plating layer 10 on the surface of upper cladding layer 24 for integration into a single board, metal plating layer 32 is formed on the surface of each lower cladding layer 22 exposed by the removal of supporting substrate 21, so that metal plating layers 10, 32 can be formed on both sides of optical waveguides 25, respectively. It is therefore possible to provide a degree of freedom to electric wires formed on the opto-electric wiring board.

(Fourth Embodiment)

FIGS. 6A to 6F are cross-sectional views illustrating a sequence of steps, one by one, in a fourth embodiment of a method of manufacturing an opto-electric wiring board according to the present invention.

The method of manufacturing an opto-electric wiring board according to the fourth embodiment differs from the first embodiment in that a perforated resin substrate is used for the supporting substrate.

In the following, the method of manufacturing an opto-electric wiring board according to the fourth embodiment will be described with reference to FIGS. 6A to 6F.

Figure 6A:
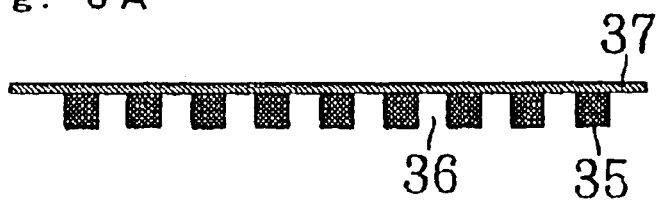
FIGS. 6A to 6F are cross-sectional views illustrating a sequence of steps, one by one, in a fourth embodiment of a method of manufacturing an opto-electric wiring board according to the present invention.

In the fourth embodiment, first, solvent soluble resin film 37 made of a polycarbonate resin having a molecular weight of approximately 15,000 and a thickness of approximately 100 $\mu$m is formed on perforated resin substrate 35 of approximately 1 mm thick made of an epoxy resin, a polyimide resin or the like (see FIG. 6A). These perforated resin substrate 35 and solvent soluble resin film 37 play together a role of supporting optical waveguide 45, later described.

Solvent soluble resin film 37 can be formed in a small thickness because it is formed on perforated resin substrate 35 (in the fourth embodiment, approximately one tenth the thickness of perforated resin substrate 35). Since a polycarbonate resin having a molecular weight of approximately 15,000 has a melting point of approximately 241° C., solvent soluble resin film 37 is heated to approximately 241° C. or higher for softening, and adhered to perforated resin substrate 35.

Perforated resin substrate 35 is used for purposes of permitting an organic solvent to act over a wide area of solvent soluble resin film 37, as will be later described. Therefore, perforation 36 is not particularly limited in shape, and one may be selected from a variety of shapes such as circle, oval, square, rectangle, polygon, and the like.

Figure 6B:
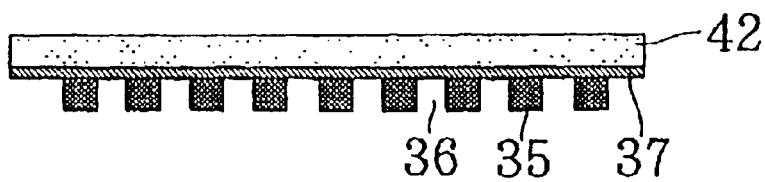

Next, similar to the step illustrated in FIG. 3B in the first embodiment, lower cladding layer (first cladding layer) 42 of approximately 20 $\mu$m thick is formed on solvent soluble resin film 37 using a thermosetting epoxy resin (see FIG. 6B).

Figure 6C:
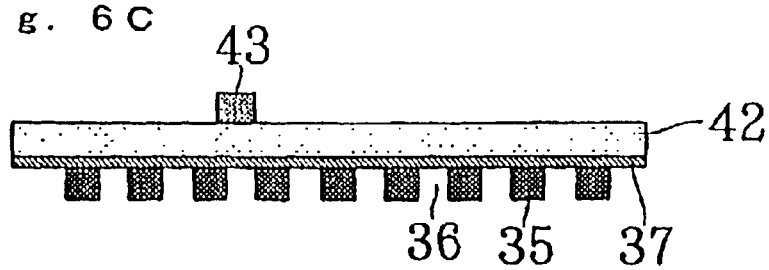

Subsequently, similar to the step illustrated in FIG. 3C in the first embodiment, core layer 43 is formed on lower cladding layer 42 using an ultraviolet-curing resin having a refractive index larger than that of lower cladding layer 42 and mainly composed of a photosensitive epoxy compound (see FIG. 6C). Core layer 43 is formed in a thickness of approximately 7 $\mu$m when a single mode optical waveguide is formed, and in a thickness of approximately 50 $\mu$m when a multi-mode optical waveguide is formed.

Figure 6D:
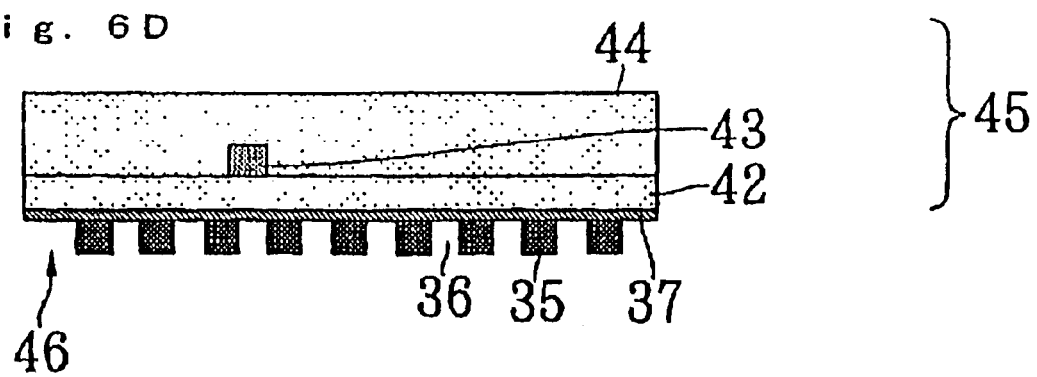
Figure 6E:
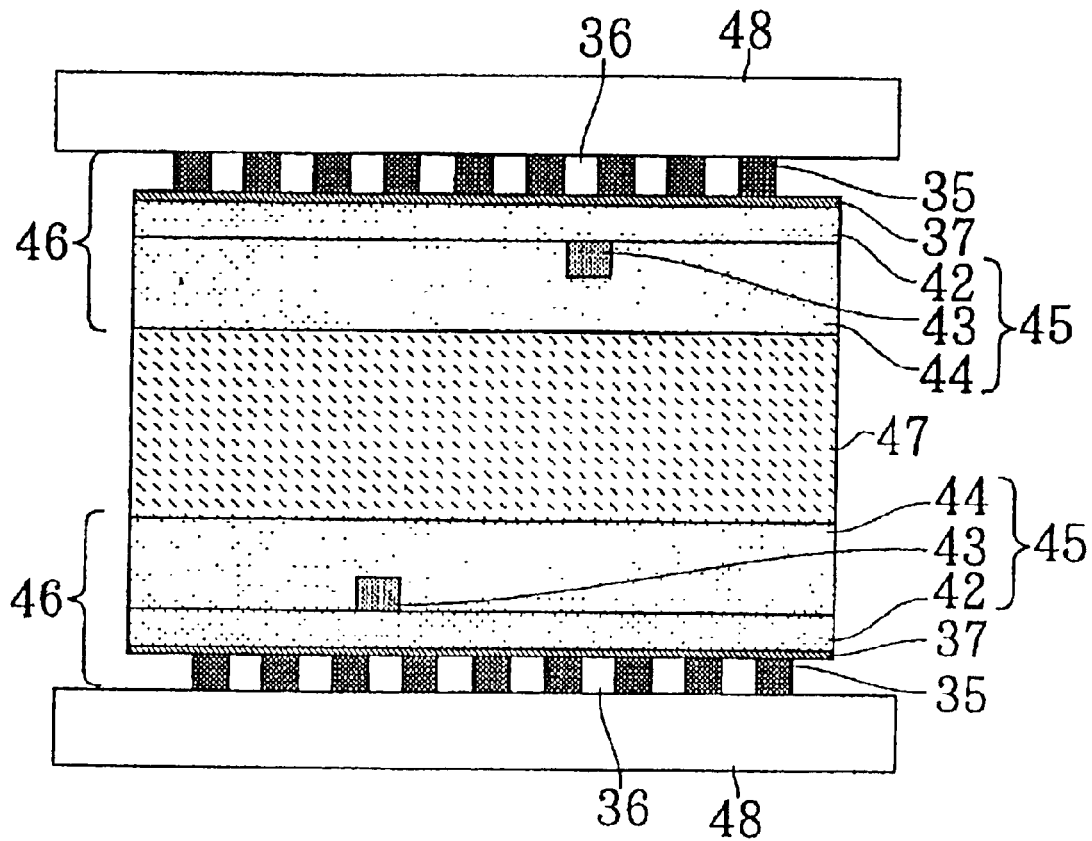
Figure 6F:
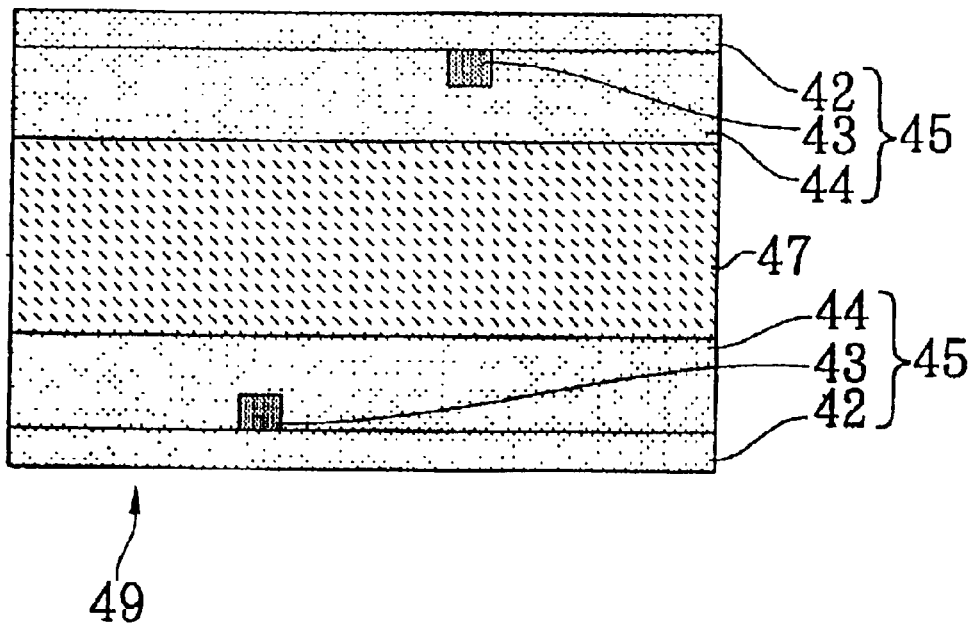

Next, similar to the step illustrated in FIG. 3D in the first embodiment, upper cladding layer (second cladding layer) 44 of 20 $\mu$m thickness is formed over the entire surface including the top of core layer 43 using a thermosetting epoxy resin having a refractive index smaller than that of core layer 43 (see FIG. 6D).

Manufactured at the end of the steps described above is optical waveguide substrate 46 formed with optical waveguide 45 on perforated resin substrate 35 through solvent soluble resin film 37. Optical waveguide substrate 46 including perforated resin substrate 35 and solvent soluble resin film 37 is used in the following manufacturing process to form an opto-electric wiring board.

In the process of manufacturing an opto-electric wiring board, similar to the step illustrated in FIG. 3E in the first embodiment, two optical waveguide substrates 46 formed through the steps illustrated in FIGS. 6A to 6D are first placed such that both upper cladding layers 44 oppose each other. Electric wiring board 47 has been previously formed using an epoxy resin or a polyimide resin. Electric wiring board 47 has a thickness of approximately 1 mm and is formed with electric wires (not shown), later described, on the surfaces. Electric wiring board 47 is sandwiched between two optical waveguide substrates 46 for integration into a single board (see FIG. 6E).

Next, similar to the step illustrated in FIG. 3F in the first embodiment, solvent soluble resin films 37 are dissolved using any of the various organic solvents enumerated above to remove perforated resin substrates 35. This results in opto-electric wiring board 49 formed with optical waveguides 45 on both sides of electric wiring board 47 (see FIG. 6F).

Since solvent soluble resin film 37 is dissolved with an organic solvent which introduces through perforation 36 formed through perforated resin substrate 35, solvent soluble resin film 37 can be removed for a shorter time, and a reduced amount of waste liquid results from the dissolution of solvent soluble resin film 37, thereby reducing an expense for removing the film. In addition, since solvent soluble resin film 37 may be formed in a small thickness on perforated resin substrate 35, a material cost can be saved.

According to the method of manufacturing the opto-electric wiring board in the fourth embodiment, after perforated resin substrates 35 including optical waveguide 45 are adhered on electric wiring board 49 through solvent soluble resin films 37, solvent soluble resin films 37 are dissolved with an organic solvent introducing through perforations 36 to remove perforated resin substrate 35, thereby eliminating any of the working steps for stripping the optical waveguide resin layer from the first supporting substrate, the working step for adhering the stripped optical waveguide resin layer again to the second supporting substrate, the working step for stripping the optical waveguide resin layer from the second supporting substrate, and the like, as required in the first prior art. Consequently, a shorter time is required for manufacturing the opto-electric wiring board to reduce the manufacturing cost.

As appreciated from the foregoing, the fourth embodiment can also provide similar advantages to the first embodiment.

Figure 7:
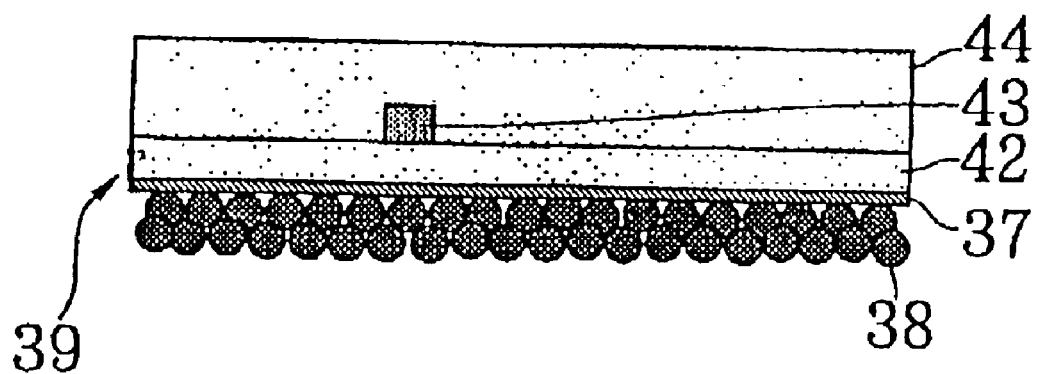
FIG. 7 is a cross-sectional view of an opto-electric wiring board illustrating an exemplary modification to the fourth embodiment illustrated in FIG. 6.

FIG. 7 illustrates an exemplary modification to the fourth embodiment of the method of manufacturing the opto-electric wiring board according to the present invention, where porous resin substrate 38 is used instead of perforated resin substrate 35.

In the exemplary modification illustrated in FIG. 7, optical waveguide 45 is formed on porous resin substrate 38 through solvent soluble resin film 37 to manufacture optical waveguide substrate 39. Then, after a step similar to that illustrated in FIG. 6E, solvent soluble resin film 37 is dissolved using any of the organic solvents enumerated above to remove porous resin substrate 38, in a manner similar to the step illustrated in FIG. 6F, thereby completing opto-electric wiring board 49 which has optical waveguide 45 adhered on electric wiring board 47. Similar advantages to those mentioned above can be provided as well by opto-electric wiring board 49 manufactured through the foregoing steps.

(Fifth Embodiment)

FIGS. 8A to 8I are cross-sectional views illustrating a sequence of steps, one by one, in a fifth embodiment of a method of manufacturing an opto-electric wiring board according to the present invention.

The method of manufacturing an opto-electric wiring board according to the fifth embodiment differs from the first embodiment in that an organic resin of a core layer is poled to form a poled polymer which is used as an optical modulator.

In the following, the method of manufacturing an opto-electric wiring board according to the fifth embodiment will be described with reference to FIGS. 8A to 8I.

Figure 8A:
FIGS. 8A to 8I are cross-sectional views illustrating a sequence of steps, one by one, in a fifth embodiment of a method of manufacturing an opto-electric wiring board according to the present invention.

In the fifth embodiment, first, a thermoplastic PPS resin is used to form a square supporting substrate 51 which is approximately 1 mm thick in the shape of a square having one side of approximately 300 mm, in a manner similar to the step illustrated in FIG. 4A in the second embodiment (see FIG. 8A).

Figure 8B:

Subsequently, electrode 50 is formed on supporting substrate 51 for poling an organic resin of core layer 53, later described (see FIG. 8B). For forming electrode 50, a copper plating layer is formed over the entire surface, for example, by an electroless copper plating method or an electrolytic copper plating method, and unnecessary portions of the copper plating layer are removed by a known photolithography technique, thereby patterning electrode 50 into a desired shape. Alternatively, electrode 50 may be formed over the entire surface rather than patterned into a desired shape.

Figure 8C:
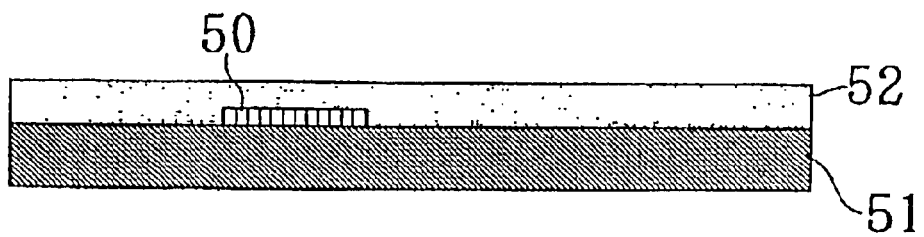

Next, similar to the step illustrated in FIG. 4B in the second embodiment, lower cladding layer (first cladding layer) 52 of approximately 20 μm thick is formed over the entire surface including the top of electrode 50 using a thermosetting epoxy resin (see FIG. 8C).

Figure 8D:
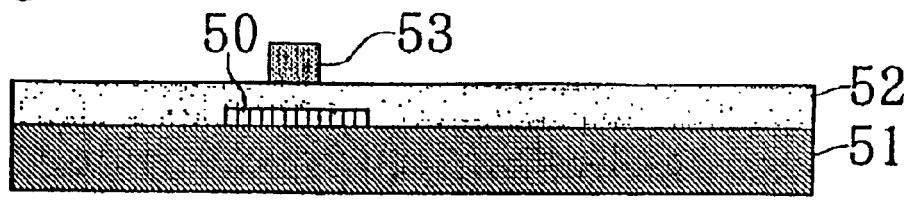

Subsequently, core layer 53 of approximately 5 μm thick is formed on lower cladding layer 52 using an organic resin having a refractive index larger than that of lower cladding layer 52 (see FIG. 8D). As will be later described in connection with FIG. 8H, core layer 53 comprises two branched paths: first branch path 53A and second branch path 53B. These first branch path 53A and second branch path 53B are coupled to each other at both ends to form single core layer 53. Core layer 53 may be formed, for example, using one of the following two manufacturing methods.

In a first manufacturing method, an acrylic ester resin such as a poly-methyl methacrylate (PMMA) resin having an organic pigment compound composed of a stilbene compound, an azo compound, an azo methylene compound and the like dispersed therein or coupled to a side chain, a polystyrene substrated resin, or the like is coated over the entire surface of lower cladding layer 52 in a thickness of approximately 5 μm, and cured.

Subsequently, the resin layer is patterned by reactive ion etching using a known photolithography technique to form core layer 53 which is branched into first branch path 53A and second branch path 53B in a transmission direction.

In a second manufacturing method, in turn, 110 parts by weight of a photosensitive cresol novolac type epoxy resin and 36 parts by weight of allyl acid are reacted at approximately 105° C. for approximately ten hours under the existence of 0.1 part by weight of hydroquinone to produce a first composition. Then, 100 parts by weight of the first composition, two parts by weight of 2,4-diethylthioxanthen, which is an organic nonlinear optical material, ten parts by weight of 4-[N(2-hydroxylethylene)-N-ethylamino]-4'- nitroazobenzene), 30 parts by weight of bisphenol A type epoxy resin, and two parts by weight of dicyandiamide are kneaded to produce a second composition.

Subsequently, a resin composed of a chloroform solution of the second composition is coated over the entire surface of lower cladding layer 52 in a thickness of approximately 5 μm by a spin coating method. Then, the resulting resin layer is directly developed using a known photolithography technique to form core layer 53 which is branched into first branch path 53A and second branch path 53B in the transmission direction.

Next, core layer 53 made of an organic resin is poled.

Figure 8E:
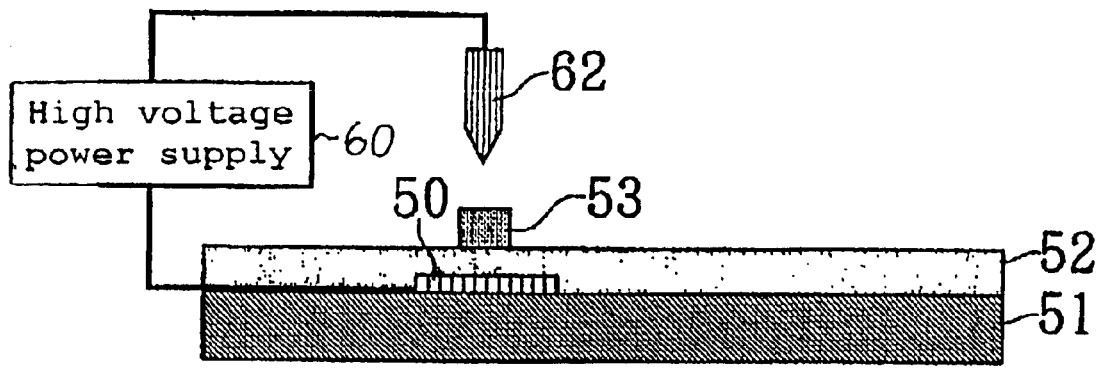

As illustrated in FIG. 8E, the poling involves the use of high voltage power supply 60 such as a corona discharger, wherein one power supply terminal of high voltage power supply 60 is connected to electrode 50, while the other power supply terminal of high voltage power supply 60 is connected to needle electrode 62 which is placed in close proximity to core layer 53. Subsequently, an electric field of 10 kV/cm, which is a critical voltage equal to or lower than a discharge voltage, is applied between electrode 50 and needle electrode 62 from high voltage power supply 60, while supporting substrate 51 is thermally treated at approximately 150° C., which is the glass transition temperature of core layer 53 or higher, for approximately one hour. Then, supporting substrate 51 is suddenly cooled down. In this event, the electric field is continuously applied until supporting substrate 51 is cooled down to approximately 30° C.

The poling causes the organic resin of core layer 53 to change from polymer to rubber through the aforementioned thermal treatment, and polymer molecules to orient in the direction of the electric field applied thereto. In addition, the organic resin is suddenly cooled down to the glass transition temperature or lower while it is applied with the electric field to freeze the orientation of the polymer, resulting in the formation of the poled polymer. The poled polymer formed in this manner produces an electro-optical effect (Pockels effect) with the linear polarizability of polymer molecules oriented in the same direction. As a result, the poled polymer can be used as an optical modulator, as will be later described.

Figure 8F:
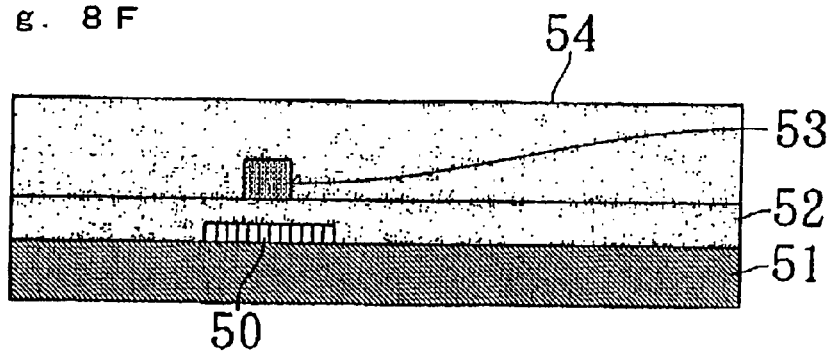

Next, similar to the step illustrated in FIG. 4D in the second embodiment, upper cladding layer (second cladding layer) 54 of approximately 20 μm thick is formed over the entire surface including the top of core layer 53 using a thermosetting epoxy resin having a refractive index smaller than that of core layer 53 (see FIG. 8F).

Figure 8G:
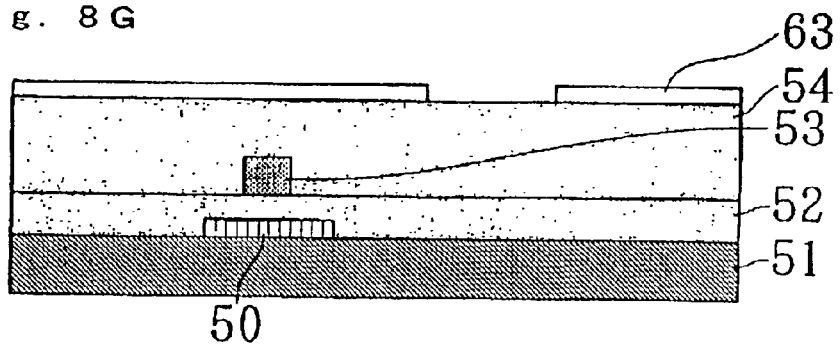

Next, similar to the step illustrated in FIG. 5C in the third embodiment, unnecessary portions of a previously formed copper plating layer are removed using a known photolithography technique to form metal plating layer 63 patterned into a desired shape on upper cladding layer 54 (see FIG. 8G). This metal plating layer 63 is used as an electric wire.

Figure 8H:
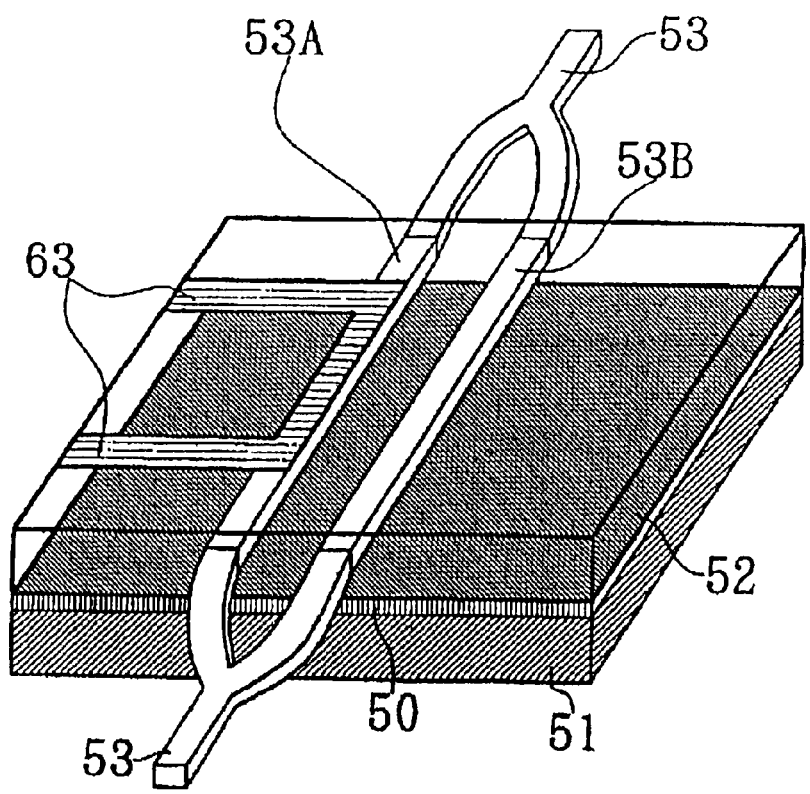

FIG. 8H is a perspective view associated with the step illustrated in FIG. 8G.

As is apparent from FIG. 8H, core layer 53 branched into first branch path 53A and second branch path 53B in the transmission direction is formed on lower cladding layer 52. Metal plating layer 63 has a shape which is a combination of a pattern perpendicular to first branch path 53A and a pattern parallel with first branch path 53A.

In the structure as described above, as a current flows into metal plating layer 63, an electric field is applied in the vertical direction in the figure with respect to poled first branch path 53A. This electric field changes the refractive index of the optical waveguide. As a result, a difference in phase is produced between an optical signal transmitted through first branch path 53A and an optical signal transmitted through second branch path 53B, causing the two optical signals to interfere at the location at which first branch path 53A is coupled to second branch path 53B. In this event, the amounts of light of the optical signals in core layer 53 are modulated in accordance with the phase difference. In other words, an optical modulator can be provided by forming the poled polymer in first branch path 53A.

Figure 8I:
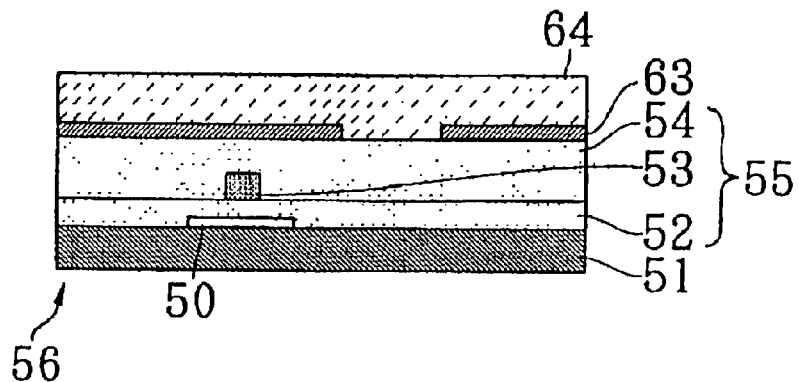

Next, similar to the step illustrated in FIG. 5D in the third embodiment, buffer resin layer 64 of approximately 50 μm thick is formed over the entire surface including the top of metal plating layer 63 using a thermosetting epoxy resin (see FIG. 8I).

Manufactured at the end of the steps described above is optical waveguide substrate 56 formed with optical waveguide 55 having core layer 53 sandwiched between lower cladding layer 52 and upper cladding layer 54 on supporting substrate 51, as well as metal plating layer 63 and buffer resin layer 64 on the surface of optical waveguide 55. Optical waveguide substrate 56 including optical waveguide 55 is used in the following manufacturing process to form opto-electric wiring board 69.

Figure 8J:
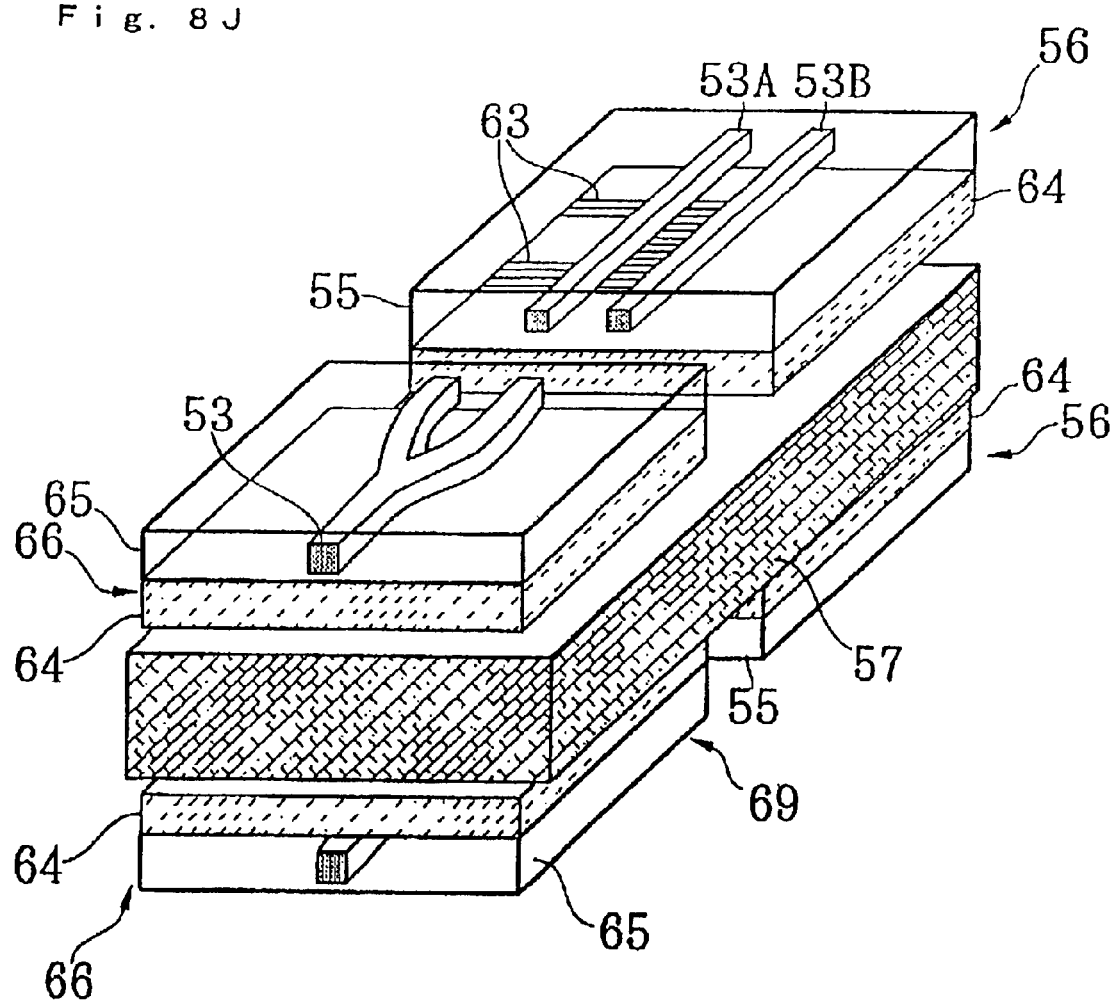
FIG. 8J is a perspective view of the opto-electric wiring board in a fifth embodiment.

In the process of manufacturing an opto-electric wiring board, similar to the step illustrated in FIG. 5E in the third embodiment, two optical waveguide substrates 56 formed through the steps illustrated in FIGS. 8A to 8I are placed such that both buffer resin layers 64 oppose each other. Electric wiring board 57 has been previously formed using an epoxy resin or a polyimide resin. Electric wiring board 57 has a thickness of approximately 1 mm and is formed with electric wires (not shown) and throughhole contacts, later described, on the surfaces. Electric wiring board 57 is sandwiched between two optical waveguide substrates 56 for integration into a single board (see FIG. 8J). In this event, optical waveguide substrate 66 formed with Y-shaped core layer 53 is integrated adjacent to optical waveguide substrate 56.

Next, similar to the step illustrated in FIG. 4F in the second embodiment, the resulting laminate is heated to approximately 260° C. or higher to melt or soften supporting substrates 51 made of the PPS resin for removal, thereby completing opto-electric wiring board 69 having optical waveguide 55 and optical waveguide 65 adhered on electric wiring board 57.

The foregoing manufacturing method permits the adhesion of optical waveguides 55, 65 manufactured in different procedures can be adhered on electric wiring board 57, thereby making it possible to readily couple different types of optical waveguides to each other.

According to the method of manufacturing the opto-electric wiring board in the fifth embodiment, after previously manufactured optical waveguide substrates 56, 66 are adhered on electric wiring board 57, the resulting laminate is heated to the heat distortion temperature of supporting substrates 51 (PPS resin) of optical waveguides 55, 65 or higher to melt or soften only supporting substrates 51 of optical waveguide substrates 56, 66 for removal, thereby eliminating any of the working step for stripping the optical waveguide resin layer from the first supporting substrate, the working step for adhering the stripped optical waveguide resin layer again to the second supporting substrate, the working step for stripping the optical waveguide resin layer from the second supporting substrate, and the like, as required in the first prior art. Consequently, a shorter time is required for manufacturing the opto-electric wiring board to reduce the manufacturing cost.

Also, the foregoing manufacturing method involves the poling on core layer 53 branched into first and second branch paths 53A, 53B in the transmission direction to form the poled polymer, and subsequent formation of a pair of metal plating layers 63 each coupled from the direction perpendicular to one branch path 53A for transmitting an electric signal in parallel with branch path 53A, thus making it possible to facilitate the formation of an optical modulator.

Further, since optical waveguides 55, 65 are adhered to electric wiring board 57 after core layer 53 is poled, opto-electric wiring board 69 can be manufactured without being damaged by the poling on electric wiring board 57. Since optical waveguides 55, 65 formed in different procedures can be adhered on electric wiring board 57, different types of optical waveguides can be readily coupled to each other.

In addition, according to the fifth embodiment, since the poled polymer can be readily formed by poling the core layer, the optical modulator can be readily provided.

While several embodiments of the present invention have been described in detail with reference to the accompanying drawings, it should be understood that the present invention is not limited to the specific structures described in the foregoing embodiments, but modifications in design and the like may be made in the invention without departing from the spirit and scope of the invention. For example, while the foregoing embodiments have illustrated opto-electric wiring boards, each of which has two optical waveguide substrates adhered to an electric wiring board, an opto-electric wiring board may comprise only one optical waveguide substrate adhered only on one side of an electric wiring board.

Also, while the first and third embodiments have illustrated an exemplary supporting substrate made of a polycarbonate resin, the supporting substrate may be made of a PPS resin instead of the polycarbonate resin.

The conditions such as the dimensions, thicknesses and the like of the supporting substrates, upper cladding layer, lower cladding layer, core layer, and the like in the respective embodiments are merely illustrative, and may be changed as appropriate in accordance with particular purposes, applications, and the like.

While the preferred embodiment of the present invention have been described using specific terms, such description is for illustrative purposes only, and it is to be understood that changes and variations may be made without departing from the spirit or scope of the following claims.

What is claimed is:

1. A method of manufacturing an optical waveguide for transmitting an optical signal, comprising:
   forming a supporting substrate made of a thermosetting resin which is removable with an organic solvent;
   forming a first cladding layer on said supporting substrate, said first cladding layer being made of a thermosetting resin;
   forming a core layer on said first cladding layer, said core layer being made of a photosensitive resin having a thermal expansion coefficient similar to that of said supporting substrate; and
   forming a second cladding layer over the entire surface including said core layer, said second cladding layer being made of a thermosetting resin.

2. The method of manufacturing an optical waveguide according to claim 1, wherein:
   said supporting substrate is made of a polycarbonate resin.

3. The method of manufacturing an optical waveguide according to claim 2, wherein:
   said polycarbonate resin has a molecular weight in a range of 10,000 to 20,000.

4. The method of manufacturing an optical waveguide according to claim 1, wherein:
   said organic solvent is one selected from the group consisting of methylenechloride, tetrachioroethene, chloroform, 1,1,2-trichloroethane, chlorobenzene, and dioxane.

5. A method of manufacturing an optical waveguide for transmitting an optical signal, comprising:
   forming a supporting substrate made of a thermosetting resin which is removable through a heating treatment;
   forming a first cladding layer on said supporting substrate, said first cladding layer being made of a thermosetting resin;
   forming a core layer on said first cladding layer, said core layer being made of a photosensitive resin having a thermal expansion coefficient similar to that of said supporting substrate; and
   forming a second cladding layer over the entire surface including said core layer, said second cladding layer being made of a thermosetting resin.

6. The method of manufacturing an optical waveguide according to claim 5, wherein:
   said supporting substrate has a heat distortion temperature in a range of 200 to 260° C.

7. The method of manufacturing an optical waveguide according to claim 6, wherein:
   said supporting substrate is made of a material selected from the group consisting of polyphenylene sulfide, polyetherimide, polyethersulphone, syndiotactic polystyrene, polysulphone, polyarylate, and polyphenyleneether.

8. A method of manufacturing an optical waveguide for transmitting an optical signal, comprising:
   forming a solvent soluble resin film on a perforated resin substrate formed with a perforation extending therethrough in a thickness direction; and
   laminating a first cladding layer, a core layer, and a second cladding layer in sequence on said solvent soluble resin film to form an optical waveguide.

9. A method of manufacturing an opto-electric wiring board using the optical waveguide manufactured by the method of manufacturing an optical waveguide according to claim 1, comprising:
   adhering an optical waveguide substrate to an electric wiring board, said optical waveguide substrate having said optical waveguide formed on a supporting substrate, said optical waveguide comprising a core layer disposed between a first cladding layer and a second cladding layer; and
   dissolving said supporting substrate using an organic solvent for removal.

10. A method of manufacturing an opto-electric wiring board using the optical waveguide manufactured by the method of manufacturing an optical waveguide according to claim 5, comprising:
    adhering an optical waveguide substrate to an electric wiring board, said optical waveguide substrate having said optical waveguide formed on a supporting substrate, said optical waveguide comprising a core layer disposed between a first cladding layer and a second cladding layer; and
    removing said supporting substrate by heating said supporting substrate to a heat distortion temperature of said supporting substrate or higher.

11. A method of manufacturing an opto-electric wiring board using the optical waveguide manufactured by the method of manufacturing an optical waveguide according to claim 8, comprising:

adhering an optical waveguide substrate to an electric wiring board, said optical waveguide substrate having said optical waveguide formed on said perforated resin substrate via said solvent soluble resin film; and dissolving said solvent soluble resin film using an organic solvent for removal.

12. The method of manufacturing an opto-electric wiring board according to claim 9, wherein:

adhering the optical waveguide substrate to the electric wiring board includes adhesively adhering said electric wiring board between two optical waveguide substrates.

13. The method of manufacturing an opto-electric wiring board according to claim 10, wherein:

adhering the optical waveguide substrate to the electric wiring board includes adhesively adhering said electric wiring board between two optical waveguide substrates.

14. The method of manufacturing an opto-electric wiring board according to claim 11, wherein:

adhering the optical waveguide substrate to the electric wiring board includes adhesively adhering said electric wiring board between two optical waveguide substrates.

15. The method of manufacturing an opto-electric wiring board according to claim 9, further comprising:

forming a first metal plating layer on said first cladding layer prior to adhering the optical waveguide substrate to the electric wiring board, said first metal plating layer functioning as a first electric wire; and forming a second metal plating layer on said second cladding layer after dissolving said supporting substrate, said second metal plating layer functioning as a second electric wire.

16. The method of manufacturing an opto-electric wiring board according to claim 10, further comprising:

forming a first metal plating layer on said first cladding layer prior to adhering the optical waveguide substrate to the electric wiring board, said first metal plating layer functioning as a first electric wire; and forming a second metal plating layer on said second cladding layer after removing said supporting substrate, said second metal plating layer functioning as a second electric wire.

17. A method of manufacturing an opto-electric wiring board comprising:

forming a supporting substrate made of a thermoplastic resin which is removable through a thermal treatment;

forming an electrode on said supporting substrate for poling;

forming a first cladding layer on said supporting substrate including said electrode, and forming a core layer on said first cladding layer, said core layer having a first branch path and a second branch path along a transmission direction;

poling said core layer;

forming a second cladding layer over the entire surface including said core layer, and forming a metal plating layer on said second cladding layer, said metal plating layer functioning as an electric wire;

adhering an optical waveguide substrate to an electric wiring board, said optical waveguide substrate having said optical waveguide formed on said supporting substrate, said optical waveguide comprising said core layer disposed between said first cladding layer and said second cladding layer; and removing said supporting substrate by heating said supporting substrate to a heat distortion temperature of said supporting substrate or higher.

18. The method of manufacturing an opto-electric wiring board according to claim 17, wherein:

poling the core layer includes connecting one of two power supply terminals of a high voltage power supply to said electrode, connecting the other one of said two power supply terminals to a needle electrode disposed in close proximity to said core layer, and applying a critical voltage equal to or lower than a discharge voltage between said electrode and said needle electrode.

19. The method of manufacturing an opto-electric wiring board according to claim 17, wherein:

forming the metal plating layer includes forming said metal plating layer at a position in close proximity to one of said first branch path and said second branch path.

* * * * *